(12) United States Patent
Horikiri et al.

(10) Patent No.: US 12,002,880 B2
(45) Date of Patent: Jun. 4, 2024

(54) METHOD FOR MANUFACTURING NITRIDE-BASED HIGH ELECTRON MOBILITY TRANSISTOR AND NITRIDE-BASED HIGH ELECTRON MOBILITY TRANSISTOR

(71) Applicant: SUMITOMO CHEMICAL COMPANY, LIMITED, Tokyo (JP)

(72) Inventors: Fumimasa Horikiri, Hitachi (JP); Noboru Fukuhara, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 297 days.

(21) Appl. No.: 17/375,947

(22) Filed: Jul. 14, 2021

(65) Prior Publication Data

US 2022/0037517 A1 Feb. 3, 2022

(30) Foreign Application Priority Data

Jul. 16, 2020 (JP) .................................. 2020-122386
Sep. 2, 2020 (JP) .................................. 2020-147715

(51) Int. Cl.
*H01L 29/778* (2006.01)
*H01L 21/02* (2006.01)
*H01L 29/04* (2006.01)
*H01L 29/20* (2006.01)
*H01L 29/66* (2006.01)

(52) U.S. Cl.
CPC .... *H01L 29/7786* (2013.01); *H01L 21/02389* (2013.01); *H01L 21/02433* (2013.01);
(Continued)

(58) Field of Classification Search
CPC ......... H01L 29/66431; H01L 29/66462; H01L 29/778–7789; H01L 2924/13064
See application file for complete search history.

(56) References Cited

U.S. PATENT DOCUMENTS

2007/0164315 A1 7/2007 Smith et al.
2013/0069173 A1* 3/2013 Chang ............... H01L 29/66901
257/E21.409
(Continued)

FOREIGN PATENT DOCUMENTS

JP 2008-227501 A 9/2008
JP 2016-225426 A 12/2016
(Continued)

OTHER PUBLICATIONS

T. Sato, M. Toguchi, Y. Komatsu and K. Uemura, "Low-Damage Etching for AlGaN/GaN HEMTs Using Photo-Electrochemical Reactions," in IEEE Transactions on Semiconductor Manufacturing, vol. 32, No. 4, pp. 483-488, Nov. 2019. (Year: 2019).*
(Continued)

*Primary Examiner* — Eric A. Ward
*Assistant Examiner* — Nora Taylor Nix
(74) *Attorney, Agent, or Firm* — Foley & Lardner LLP

(57) ABSTRACT

There is provided a method for manufacturing a nitride-based high electron mobility transistor, including: providing a conductive member on a nitride semiconductor crystal substrate, outside an element region in a plan view; forming a mask on the substrate, the mask having an opening in at least one of a source recess etching region and a drain recess etching region; performing photoelectrochemical etching by irradiating the substrate with light to form at least one of a source recess and a drain recess, in a state where the substrate on which the conductive member is provided and the mask is formed is in contact with an etching solution containing an oxidizing agent that receives electrons; and forming an element separation structure of the high electron mobility transistor.

17 Claims, 14 Drawing Sheets

(52) U.S. Cl.
CPC .......... *H01L 29/04* (2013.01); *H01L 29/2003* (2013.01); *H01L 29/66431* (2013.01)

(56) References Cited

U.S. PATENT DOCUMENTS

| | | | | |
|---|---|---|---|---|
| 2013/0193485 | A1* | 8/2013 | Akiyama | H01L 29/66462 257/194 |
| 2016/0260827 | A1* | 9/2016 | Nishimori | H01L 29/41766 |
| 2020/0006543 | A1* | 1/2020 | Tu | H01L 29/66462 |
| 2022/0148883 | A1 | 5/2022 | Horikiri et al. | |

FOREIGN PATENT DOCUMENTS

| | | |
|---|---|---|
| JP | 2018-195609 A | 12/2018 |
| JP | 6668546 B1 | 3/2020 |

OTHER PUBLICATIONS

R Kudrawiec et al 2008 J. Phys. D: Appl. Phys. 41 165109 (Year: 2008).*
Enling Li et al 2011 J. Phys.: Conf. Ser. 276 012044 (Year: 2011).*
Zhili Zhang et al 2016 Appl. Phys. Express 9 084102. (Year: 2016).*
Miwa et al., "Self-termination of contactless photo-electrochemical (PEC) etching on aluminum gallium nitride/gallium nitride heterostructures," Applied Physics Express, vol. 13, 2020, pp. 026508-1 to 026508-4.
Samukawa, Seiji, "Ultimate Top-down Etching Processes for Future Nanoscale Devices: Advanced Neutral-Beam Etching," Japanese Journal of Applied Physics, vol. 45, No. 4A, 2006, pp. 2395-2407.
Ohba et al., "Atomic layer etching of GaN and AlGaN using directional plasma-enhanced approach," Japanese Journal of Applied Physics, vol. 56, 2017, pp. 06HB06-1 to 06HB06-3.

* cited by examiner

METHOD FOR MANUFACTURING NITRIDE-BASED HIGH ELECTRON MOBILITY TRANSISTOR AND NITRIDE-BASED HIGH ELECTRON MOBILITY TRANSISTOR

BACKGROUND

Technical Field

The present disclosure relates to a method for manufacturing a nitride-based high electron mobility transistor and a nitride-based high electron mobility transistor.

Description of Related Art

Group III nitrides such as gallium nitride (GaN) are used as materials for manufacturing semiconductor devices such as light emitting devices and transistors.

Photoelectrochemical (PEC) etching has been proposed as an etching technique for forming various structures on Group III nitrides such as GaN (see, for example, Non-Patent Document 1). The PEC etching is a wet etching with less damage than a general dry etching, and is preferable because a device is simple, compared to special dry etching with less damage such as neutral particle beam etching (see, for example, Non-Patent Document 2) and atomic layer etching (see, for example, Non-Patent Document 3).

PRIOR ART DOCUMENT

Non-Patent Document

[Non-Patent Document 1] K. Miwa, Appl. Phys. Express 13, 026508 (2020).
[Non-Patent Document 2] S. Samukawa, JJAP, 45 (2006) 2395.
[Non-Patent Document 3] T. Ohba, Jpn. J. Appl. Phys. 56, 06HB06 (2017).

SUMMARY OF THE INVENTION

An object of the present disclosure is to provide a PEC etching technique used for manufacturing a nitride-based high electron mobility transistor.

According to an aspect of the present disclosure, there is provided a method for manufacturing a nitride-based high electron mobility transistor, including:
  providing a conductive member on a nitride semiconductor crystal substrate, outside an element region of the high electron mobility transistor in a plan view;
  forming a mask having an opening in at least one of a source recess etching region where a source recess is formed, which is a recess in which a source electrode of the high electron mobility transistor is arranged, and a drain recess etching region where a drain recess is formed, which is a recess in which a drain electrode of the high electron mobility transistor is arranged;
  performing photoelectrochemical etching by irradiating the nitride semiconductor crystal substrate with light to form at least one of a source recess and a drain recess, in a state where the nitride semiconductor crystal substrate on which the conductive member is provided and the mask is formed is in contact with an etching solution containing an oxidizing agent that receives electrons; and
  forming an element separation structure of the high electron mobility transistor.

According to other aspect of the present disclosure, there is provided a nitride-based high electron mobility transistor, including:
  a group III nitride layer having at least a channel layer, a barrier layer arranged on the channel layer, and a cap layer arranged on the barrier layer;
  a source electrode, a gate electrode, and a drain electrode;
  an element separation structure; and
  at least one of a source recess formed on the group III nitride layer and a drain recess formed on the group III nitride layer,
  wherein plasma damage is not introduced into at least a group III nitride layer located directly under the source electrode and the drain electrode.

Advantage of the Invention

There is provided a PEC etching techniques used in a manufacture of a nitride-based high electron mobility transistor.

DETAILED DESCRIPTION OF THE DISCLOSURE

In a high electron mobility transistor (nitride-based high electron mobility transistor) using a group III nitride, a technique of forming a cap layer on a barrier layer is used. The barrier layer is made of, for example, aluminum gallium nitride (AlGaN), and the cap layer is made of, for example, GaN. Hereinafter, the nitride-based high electron mobility transistor is also simply referred to as HEMT.

In a conventional technique, a source electrode and a drain electrode of HEMT are formed on the cap layer, and due to this, a contact resistance of the source electrode and the drain electrode cannot be reduced.

It is conceivable to reduce the contact resistance of the source electrode and the drain electrode by removing the cap layer. However, the conventional technique for etching the cap layer is dry etching, and due to an etching damage caused by the dry etching, the contact resistance cannot be reduced even when the cap layer is removed.

Photoelectrochemical (PEC) etching has been proposed as a new technique for etching group III nitrides such as GaN while suppressing etching damage. As a PEC etching technique related to HEMT, the inventors of the present application have so far proposed a technique for forming a gate recess by PEC etching by using a source electrode or a drain electrode as a cathode pad (Japanese Patent Application No. 2019-140027). The cathode pad is a conductive member used for advancing electrodeless PEC etching, as will be described in detail later.

In the gate recess forming technique, the cap layer interposed under the source electrode or the drain electrode could not be removed by PEC etching. The source electrode and the drain electrode are formed on the cap layer, and it was not possible to reduce a contact resistance caused by the cap layer of the source electrode and the drain electrode.

By using the PEC etching, etching damage can be suppressed and the cap layer can be removed. However, it is not known how to perform the PEC etching to remove the cap layer under the source electrode or under the drain electrode. The present inventors propose such a technique in the following embodiments.

Embodiment

Figure 1A:
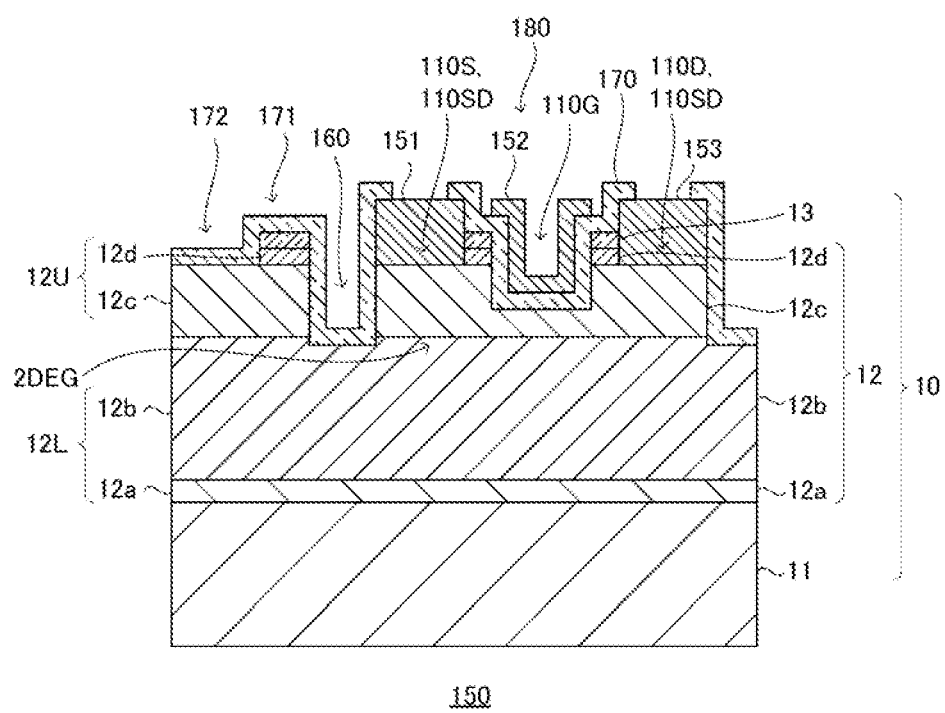
FIG. 1A is a schematic cross-sectional view illustrating HEMT according to an embodiment of the present disclosure.

A nitride-based high electron mobility transistor (HEMT) 150 according to an embodiment of the present disclosure will be described. FIG. 1A is a schematic cross-sectional view illustrating HEMT 150, showing one HEMT element. The HEMT 150 includes a laminate 10, a source electrode 151, a gate electrode 152, a drain electrode 153, an element separation structure 160, and an insulating film 170.

The laminate (nitride semiconductor crystal substrate) 10 has a substrate (base substrate) 11 and a group III nitride layer 12 (hereinafter, also referred to as an epi layer 12) formed on the substrate 11. The substrate 11 is a crystal substrate that serves as a base for epitaxially growing the epi layer 12, and for example, a semi-insulating substrate is used as the substrate 11. Here, "semi-insulating property" means, for example, a state in which a specific resistance is $10^5$ Ωcm or more. As the semi-insulating substrate, for example, a semi-insulating silicon carbide (SiC) substrate is used, and for example, a semi-insulating gallium nitride (GaN) substrate is used. The semi-insulating GaN substrate is, for example, a (Fe)-doped or manganese (Mn)-doped GaN substrate.

A laminated structure including, for example, a nucleation layer 12a made of aluminum nitride (AlN), a channel layer 12b made of GaN, a barrier layer 12c made of gallium nitride (AlGaN), and a cap layer 12d made of GaN, is used as the epi layer 12 at the time of using the SiC substrate for the substrate 11.

In the laminated structure of the channel layer 12b and the barrier layer 12c, a two-dimensional electron gas (2DEG) serving as a channel of HEMT 150 is formed in the vicinity of an upper surface of the channel layer 12b. AlGaN may be used as a material of the channel layer 12b, in addition to GaN. A material having a lower Al composition (smaller bandgap) than the AlGaN used for the barrier layer 12c is used as the AlGaN used for the channel layer 12b.

The substrate 11 is not limited to the SiC substrate, and other substrates (sapphire substrate, silicon (Si) substrate, (semi-insulating) GaN substrate, etc.) may be used. The laminated structure of the epi layer 12 may be appropriately selected depending on the type of the substrate 11, the characteristics of the HEMT 150 to be obtained, and the like. For example, in the epi layer 12 when a GaN substrate is used as the substrate 11, the nucleation layer 12a may be omitted.

An upper surface of the epi layer 12 is composed of a c-plane of the group III nitride constituting the epi layer 12. "composed of a c-plane" means that a crystal plane with a lowest index closest to the upper surface is the c-plane of the Group III nitride crystal constituting the epi layer 12. The Group III nitride constituting the epi layer 12 has dislocations (through dislocations), and the dislocations are distributed at a predetermined density on the upper surface.

The laminate 10 may have a passivation insulating film 13 (hereinafter, also referred to as an insulating film 13) arranged on the epi layer 12. The insulating film 13 is made of, for example, silicon nitride.

Of the epi layer 12, a portion under the channel layer 12b is referred to as an epi lower layer 12L, and a portion above the channel layer 12b is referred to as an epi upper layer 12U. The epi lower layer 12L includes the channel layer 12b in which 2DEG is formed. The epi upper layer 12U includes the barrier layer 12c formed on the channel layer 12b and the cap layer 12d formed on the barrier layer 12c. The barrier layer 12c is composed of a group III nitride having a bandgap larger than that of the group III nitride constituting the channel layer 12b, to generate 2DEG in the channel layer 12b. The cap layer 12d is composed of a group III nitride having a smaller bandgap than the group III nitride constituting the barrier layer 12c.

In the HEMT 150 of the present embodiment, the gate electrode 152 is arranged in a gate recess 110G, the source electrode 151 is arranged in a source recess 110S, and the drain electrode 153 is arranged in a drain recess 1101D. The gate recess 110G, the source recess 110S, and the drain recess 1101D are recesses formed in the epi upper layer 12U (structure formed by etching the epi upper layer 12U), respectively. Hereinafter, the source recess 110S and the drain recess 110D may be collectively referred to as an ohmic recess 110SD (to represent at least one of the source recess 110S and drain recess 110D without any distinction).

The gate recess 110G is a recess formed in the epi upper layer 12U by etching the cap layer 12d and a part of the barrier layer 12c, and the barrier layer 12c is exposed at a bottom of the gate recess 110G. A thickness of the barrier layer 12c under the gate recess 110G (thickness from the upper surface of the channel layer 12b to the bottom of the gate recess 110G) may be set to a predetermined value so that a threshold gate voltage of the HEMT150 becomes a predetermined value.

The ohmic recess 110SD is a recess formed in the epi upper layer 12U by etching the cap layer 12d (only), and the barrier layer 12c is exposed at a bottom of the ohmic recess 110SD. The ohmic recess 110SD is shallower than the gate recess 110G. Since the source electrode 151 and the drain electrode 153 are respectively arranged in the ohmic recess 110SD, the contact resistance of the source electrode 151 and the drain electrode 153 can be reduced. It is considered that this is because the source electrode 151 and the drain electrode 153 come into direct contact with the barrier layer 12c, and lifting of the band caused by the cap layer 12d is suppressed.

The gate electrode 152 is formed of, for example, a Ni/Au layer in which a gold (Au) layer is laminated on a nickel (Ni) layer. Each of the source electrode 151 and the drain electrode 153, is formed of, for example, a Ti/Al/Ti/Au layer in which an aluminum (Al) layer is laminated on a titanium (Ti) layer, a Ti layer is laminated on the Al layer, and an Au layer is further laminated on the Ti layer.

The element separation structure 160 is a structure that divides the cap layer 12d and 2DEG between adjacent HEMT elements, and the HEMT elements adjacent to each other with the element separation structure 160 interposed between them, are electrically separated from each other. As the element separation structure 160, for example an element separation groove is shown in the present embodiment, but the element separation structure 160 may be formed by ion implantation instead of forming the groove. The element separation structure 160, which is an element separation groove, is formed so that its bottom reaches a depth in the middle of the channel layer 12b.

The element separation structure 160 defines an element region 180 that functions as a HEMT element. In a plan view, an internal region of a closed edge (HEMT element side, that is, an inner edge) surrounding the HEMT element of the element separation structure 160 is an element region 180 (see FIG. 7A).

The insulating film 170 has an opening on upper surfaces of the source electrode 151 and the drain electrode 153, covers the element separation structure 160, and extends to the outside of the element separation structure 160. The insulating film 170 of the present embodiment is provided as a gate insulating film, and is interposed between the gate recess 110G and the gate electrode 152. The insulating film 170 is made of, for example, aluminum oxide.

According to the present embodiment, an ohmic recess 110SD is formed by etching the epi-upper layer 12U by photoelectrochemical (PEC) etching. Also, according to the present embodiment, the gate recess 110G is also formed by etching the epi upper layer 12U by PEC etching. In the manufacturing step of the HEMT150, an intermediate structure that is subjected to various processing until the HEMT150 is completed, is referred to as a processing object 100.

Figure 1B:
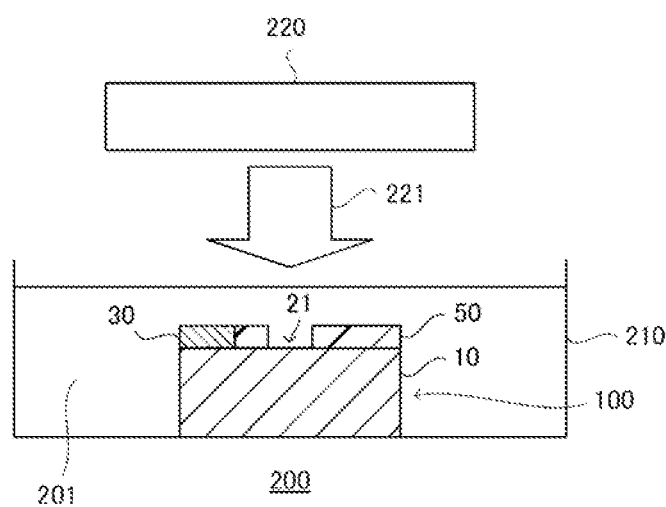
FIG. 1B is a schematic cross-sectional view illustrating a PEC etching apparatus.

FIG. 1B is a schematic cross-sectional view illustrating a PEC etching apparatus 200. The PEC etching apparatus 200 includes a container 210 for accommodating a processing object 100 and an etching solution 201, and a light source 220 for emitting light 221.

The processing object 100 in the PEC etching includes a laminate 10 (at least the epi lower layer 12L and the epi upper layer 12U), a cathode pad 30, and a mask 50. The laminate 10 (more specifically, the epi upper layer 12U) has a region 21 to be etched (etching region 21) that is etched by the PEC etching. The region 21 to be etched is defined by the mask 50. The processing object 100 in the PEC etching is more specifically illustrated in FIGS. 2C and 3B.

The PEC etching is performed by irradiating the region 21 to be etched with light 221 through the etching solution 201, in a state where the processing object 100 is immersed in the etching solution 201, and the region 21 to be etched and the cathode pad 30 are in contact with the etching solution 201 (the PEC etching is performed by irradiating the laminate 10 with light 221, in a state where the laminate 10 on which the cathode pad 30 is provided and the mask 50 is formed, is in contact with the etching solution 201).

A mechanism of the PEC etching will be described, and the etching solution 201, the cathode pad 30, and the like will be described in more detail. Gallium nitride (GaN) will be described as an example of the group III nitride that is PEC-etched.

The PEC etching is a wet etching, and is performed in a state where the processing object 100 is immersed in the etching solution 201. An alkaline or acidic etching solution 201 containing oxygen used to generate an oxide of a Group III element contained in the Group III nitride constituting the region 21 to be etched, and further containing an oxidizing agent that receives electrons, is used as the etching liquid 201.

Peroxodisulfuric acid ion ($S_2O_8^{2-}$) is preferably used as the oxidizing agent, and an aqueous solution obtained by dissolving a salt of (at least) peroxodisulfuric acid ion ($S_2O_8^{2-}$) in water at a predetermined concentration is used as the etching solution 201. More specifically, the oxidizing agent functions in such a manner that a sulfate ion radical ($SO_4^{-*}$) generated from $S_2O_8^{2-}$ receives electrons and changes into a sulfate ion ($SO_4^{2-}$).

The salt of $S_2O_8^{2-}$ used in the etching solution 201, includes, for example, ammonium persulfate $(NH_4)_2S_2O_8$, potassium peroxodisulfate $(K_2S_2O_8)$, sodium peroxodisulfate $(Na_2S_2O_8)$, etc. From a viewpoint of suppressing a residual alkali metal element caused by the etching solution 201, it is preferable to use $(NH_4)_2S_2O_8$ which does not contain alkali metal.

All of these aqueous solutions of $S_2O_8^{2-}$ salts are acidic. For example, an alkaline etching solution 201 can be obtained by mixing an alkaline aqueous solution such as a KOH aqueous solution with an aqueous solution of these $S_2O_8^{2-}$ salts at an appropriate concentration.

The reaction in the PEC etching of the present embodiment can be summarized as in (Chemical formula 1).

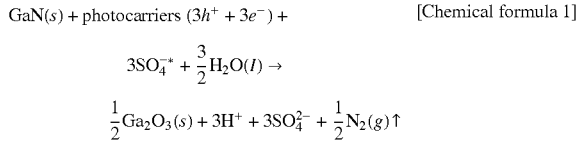

[Chemical formula 1]

The reaction for producing $SO_4^{-*}$ from $S_2O_8^{2-}$ contained in the etching solution is shown in (Chemical formula 2). That is, $SO_4^{-*}$ can be produced by at least one of heating $S_2O_8^{2-}$ and irradiating $S_2O_8^{2-}$ with light.

[Chemical formula 2]

As shown in (Chemical formula 1), holes ($h^+$) and electrons ($e^-$) are generated in the Group III nitride by irradiating the group III nitride with light 221 having a wavelength corresponding to a band gap of the group III nitride or a wavelength less than this wavelength (in this example, ultraviolet light 221 having a wavelength of 365 nm or less corresponding to the band gap of GaN). Due to generation of the holes, the group III nitride (GaN in this example) is decomposed into group III element cations ($Ga^{3+}$ in this example) and nitrogen gas ($N_2$ gas), and the cations of the Group III element combine with oxygen contained in water ($H_2O$) to generate an oxide of the Group III element ($Ga_2O_3$ in this example). The oxide of the group III element is dissolved in the alkaline or acidic etching solution 201, to thereby etch the group III nitride. The electrons generated in the Group III nitride are consumed by combining with $SO_4^{-*}$ to generate $SO_4^{2-}$. As the PEC etching proceeds, a hydrogen ion (H+) concentration increases, which reduces pH of the etching solution 201.

The PEC etching can be performed regardless of whether the etching solution 201 is alkaline or acidic. However, when using a resist mask, it is preferable to use an etching solution 201 that is acidic (from the start of the PEC etching), because resist masks have low resistance to alkalis.

Further, as described in other embodiments described later, it is preferable to use the etching solution 201 which is acidic (from the start of the PEC etching), from a viewpoint of self-stopping PEC etching by reducing 2DEG (suppressing excessively deep PEC etching).

Figure 8A:
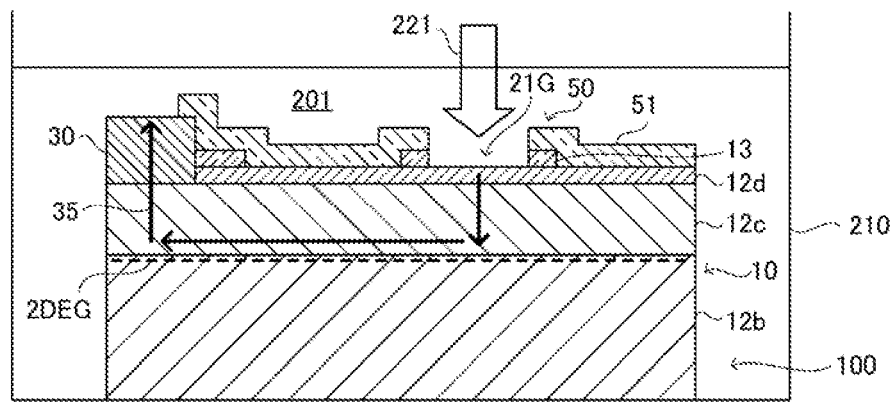
FIGS. 8A and 8B are schematic cross-sectional views schematically illustrating a mechanism of PEC etching for forming a gate recess.

The cathode pad 30 is a conductive member made of a conductive material such as metal, and is provided so as to be in contact with at least a part of a surface of a conductive region of the processing object 100 which is electrically connected to the region 21 to be etched through at least one of the cap layer 12d and 2DEG (see FIG. 8A). Further, the cathode pad 30 is provided so that at least a part of the cathode pad 30, for example, an upper surface thereof comes into contact with the etching solution 201 during the PEC etching. The cathode pad 30 is made of, for example, titanium (Ti).

In the region 21 to be etched by the PEC etching, the oxide of the group III element is generated due to the generation of the holes by light irradiation. That is, the region 21 to be etched functions as an anode in which the holes are consumed. Due to irradiating the region 21 to be etched with light, the electrons generated in pairs with the holes can flow to the cathode pad 30 through at least one of the cap layer 12d and 2DEG. The surface of the cathode pad 30 that comes into contact with the etching solution 201, functions as a cathode consumed by emitting the electrons to the etching solution 201. By making the cathode pad 30 function as a cathode in this way, the PEC etching can proceed.

In the PEC etching according to the present embodiment, the PEC etching can proceed by consuming the electrons generated together with the holes by light irradiation of the Group III nitride by $S_2O_8^{2-}$ (more specifically, $SO_4^{-*}$ generated from $S_2O_8^{2-}$) contained in the etching solution 201 as an oxidizing agent. That is, the PEC etching can be performed in such a manner that the electrons are directly emitted from the processing object 100 into the etching solution 201 (without passing through external wiring).

In contrast, a PEC etching technique that does not use such an oxidizing agent, includes PEC etching performed in such a manner that electrons generated in the Group III nitride are discharged into an etching solution from a cathode electrode immersed in the etching solution, through wiring extending outside the etching solution. In contrast of electroded PEC etching using such a cathode electrode, the PEC etching according to the present embodiment is an electrodeless (contactless) PEC etching that does not require such a cathode electrode.

The PEC etching can also be performed to the group III nitride other than the exemplified GaN. The group III element contained in the group III nitride may be at least one of aluminum (Al), gallium (Ga) and indium (In). The concept of the PEC etching for the Al component or In component in the Group III nitride is the same as the concept described for the Ga component with reference to (Chemical Formula 1). That is, the PEC etching can be performed by generating the holes by irradiating the group III nitride with light to generate an oxide of Al or an oxide of In, and dissolving these oxides in an alkaline or acidic etching solution. The wavelength of the light 221 for irradiation may be appropriately changed depending on the composition of the Group III nitride to be etched. When Al is contained based on the PEC etching of GaN, light 221 having a shorter wavelength may be used, and when In is contained, light 221 having a longer wavelength can also be used. That is, the light 221 having a wavelength at which the Group III nitride is PEC-etched can be appropriately selected and used, depending on the composition of the Group III nitride to be etched.

Next, a manufacturing method of the HEMT150 according to the present embodiment will be described. The manufacturing method of the present embodiment includes:
  providing a cathode pad 30 on a laminate 10 outside an element region 180 of a HEMT 150 in a plan view (see FIGS. 2B and 6A);
  forming a mask 50 on the laminate 10, the mask having an opening in a region 21 SD to be etched in which an ohmic recess 110SD is formed (see FIG. 3B);
  forming an ohmic recess 110SD by PEC etching (see FIG. 3C); and forming an element separation structure 160 (see FIG. 4B).

A plurality of HEMT elements are periodically arranged side by side in at least one direction of a gate length direction and a gate width direction, on a wafer of the laminate 10 on which the HEMT150 is formed. Correspondingly, a plurality of cathode pads 30 may be periodically arranged side by side in at least one direction of the gate length direction and the gate width direction.

FIGS. 2A to 5C are schematic cross-sectional views illustrating a manufacturing process of the HEMT150 according to the present embodiment. In order to avoid complexity of the drawing, FIGS. 2A to 5C illustrates a portion of the laminated 10 above the channel layer 12b. FIGS. 2A to 5C illustrate a cross-sectional view of one HEMT element.

FIGS. 6A to 7B are schematic plan views illustrating a manufacturing process of the HEMT150 according to the present embodiment. FIGS. 6A to 7B illustrate a plan view of two HEMT elements arranged in a gate length direction.

Figure 2A:
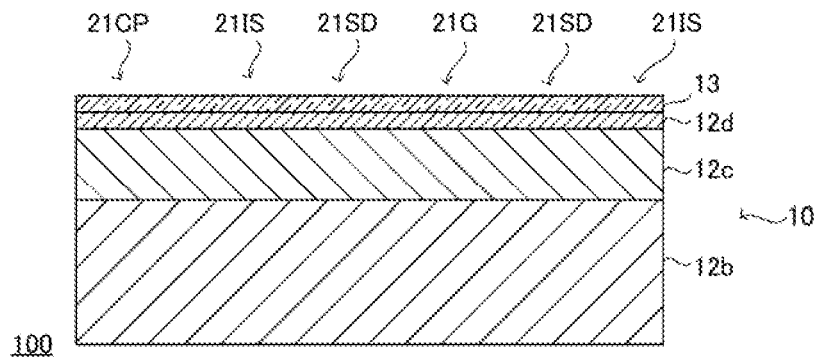
FIGS. 2A to 2C are schematic cross-sectional views illustrating HEMT manufacturing steps according to the present embodiment.

FIG. 2A is used for reference. A wafer of the laminate 10 is prepared. The laminate 10 has regions to be etched 21G, 21SD, 21IS and 21CP. The region to be etched 21G is a region to be etched to form a gate recess 110G, which is a recess in which the gate electrode 152 is arranged. The region to be etched 21SD is a region to be etched to form an ohmic recess 110SD, which is a recess in which the source electrode 151 or the drain electrode 153 is arranged. The region to be etched 21IS is a region to be etched to form the element separation structure 160 which is an element separation groove. The region 21CP to be etched is a region to be etched to form a recess 110CP in which the cathode pad 30 is arranged. Hereinafter, each of the regions to be etched 21G to 21CP is also simply referred to as regions 21G to 21CP respectively.

Figure 2B:
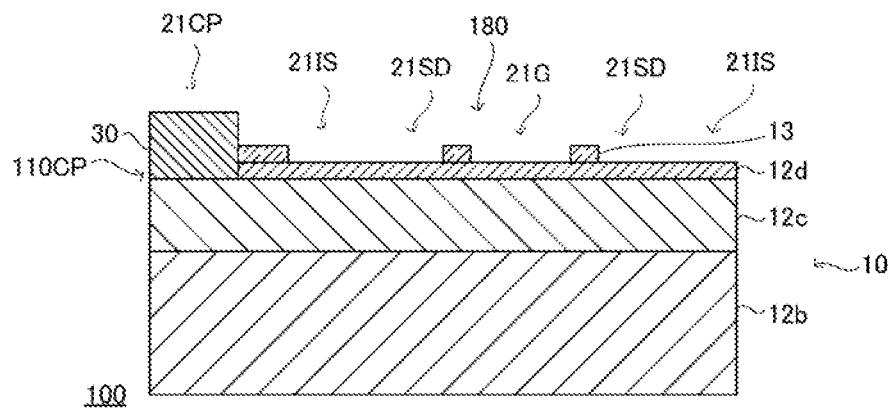

FIG. 2B is used for reference. By photolithography and etching, recesses in which the cap layer 12d is exposed are formed in the regions 21G, 21SD, 21IS, and 21CP of the insulating film 13. For etching of the insulating film 13, for example, wet etching with a buffered hydrofluoric acid aqueous solution, a hydrofluoric acid aqueous solution, or the like is used, and further, for example, low-damage dry etching by atomic layer etching, neutral particle beam etching, or the like is used.

Further, by photolithography and etching, a recess 110CP in which the barrier layer 12c is exposed on the bottom, is formed in the region 21CP of the cap layer 12d. For the etching of the cap layer 12d forming the recess 110CP, for example, low-damage dry etching by atomic layer etching, neutral particle beam etching, or the like is used.

After forming the recess 110CP, for example, a Ti film is deposited on an entire upper surface of the processing object 100, and the cathode pad 30 is formed by removing an unnecessary Ti film on the outside of the recess 110CP by lift-off.

Since the cap layer 12d is usually doped into n-type (having n-type conductivity), the cathode pad 30 may be formed on the cap layer 12d. By forming the cap layer 12d in the recess 110CP from which the cap layer 12d has been removed, that is, directly above the barrier layer 12c, the contact resistance of the cathode pad 30 can be reduced. On the other hand, by forming the cathode pad 30 on the cap layer 12d, the steps of photolithography and etching for removing the cap layer 12d of the recess 110CP can be omitted.

The cathode pad 30 formed on the cap layer 12d or the barrier layer 12c and the region 21 to be PEC-etched using the cathode pad 30, are electrically connected through at least one of the cap layer 12d and 2DEG. The conductivity of 2DEG is higher than that of the cap layer 12d.

Figure 2C:
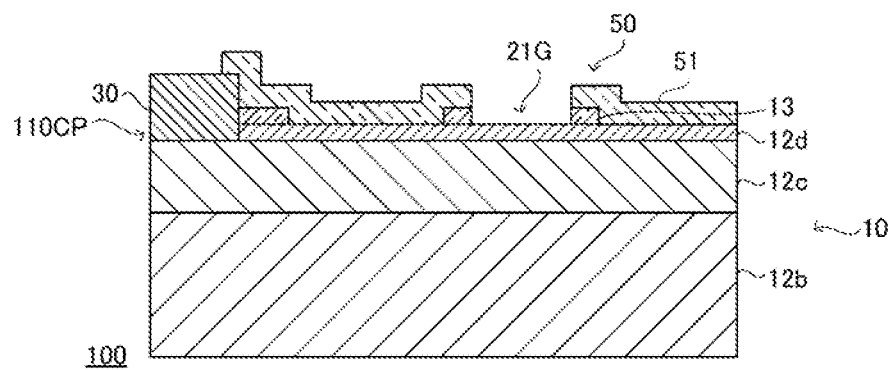

FIG. 2C is used for reference. For example, a silicon oxide film is deposited on the entire upper surface of the processing object 100. By photolithography and etching, the portion of the silicon oxide film located on the region 21G and the upper surface of the cathode pad 30 is removed, to form a hard mask 51 arranged above the cap layer 12d. For the etching of the silicon oxide film, for example, a buffered hydrofluoric acid aqueous solution is used. As used herein, a hard mask means a mask made of an inorganic or metallic material (as opposed to a resist mask made of an organic material).

Figure 3A:
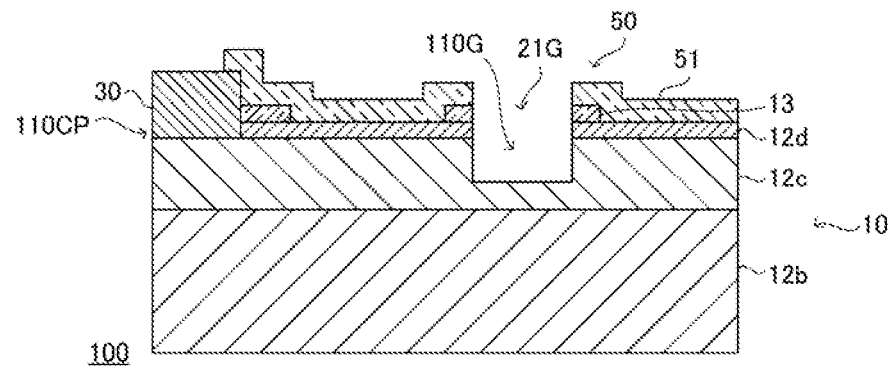
FIGS. 3A to 3C are schematic cross-sectional views illustrating HEMT manufacturing steps according to the present embodiment.

FIG. 3A is used for reference. The gate recess 110G is formed by etching the cap layer 12d and the barrier layer 12c of the region 21G by PEC etching using the hard mask 51 (and the insulating film 13 or the like interposed under the hard mask 51) as the mask 50.

Figure 8B:
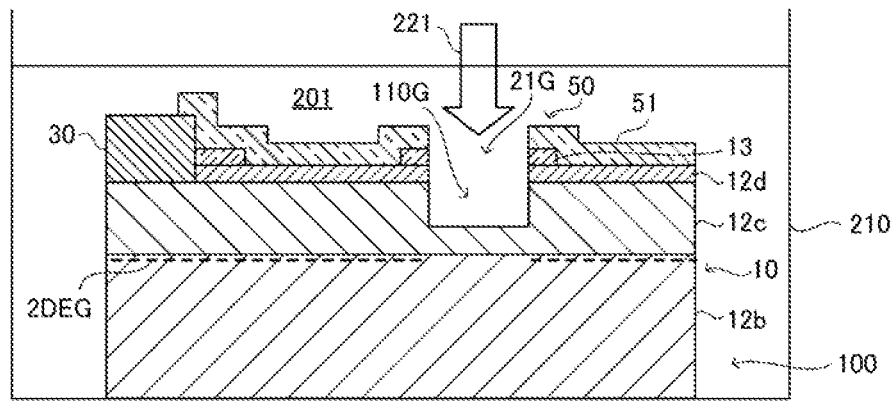

FIGS. 8A and 8B are schematic cross-sectional views schematically illustrating a mechanism of the PEC etching for forming the gate recess 110G. FIG. 8A illustrates a situation in which the PEC etching proceeds, and FIG. 8B illustrates a situation in which the PEC etching is stopped.

As described above, electrons generated by light irradiation toward the region 21G to be etched flow to the cathode pad 30 through at least one of the cap layer 12d and 2DEG, and discharged from the surface of the cathode pad 30 to the etching solution 201, to thereby make the PEC etching proceed. FIG. 8A illustrates a schematic flow of the electrons indicated by an arrow 35.

When the barrier layer 12c becomes thinner as the PEC etching proceeds and the 2DEG under the gate recess 110G decreases, the PEC etching becomes difficult to proceed, and eventually, as illustrated in FIG. 8B, the PEC etching automatically stops (self-stop) with the barrier layer 12c having a predetermined thickness remaining under the gate recess 110G. The predetermined thickness can be adjusted by, for example, the intensity of light 221 and can be set so that a threshold gate voltage of the HEMT 150 becomes a predetermined value.

Figure 3B:
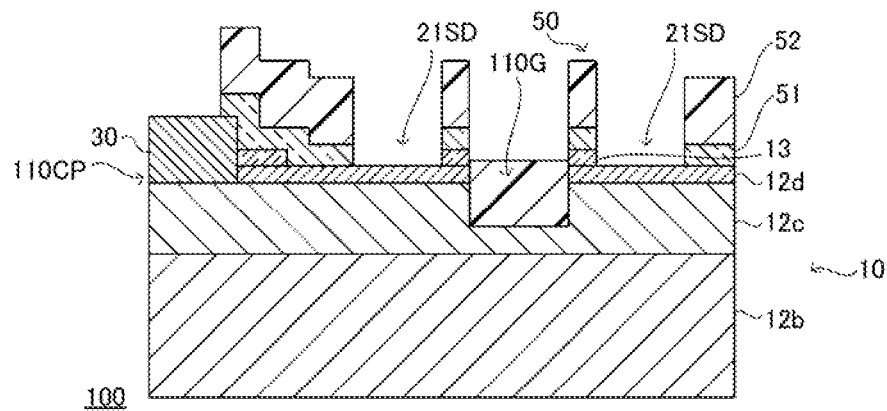

FIG. 3B is used for reference. A resist mask 52 (mask 50) having an opening on the region 21SD and the upper surface of the cathode pad 30, is formed. By etching the hard mask 51 on the region 21SD using the resist mask 52 as a mask, the cap layer 12d of the region 21SD is exposed.

Figure 3C:
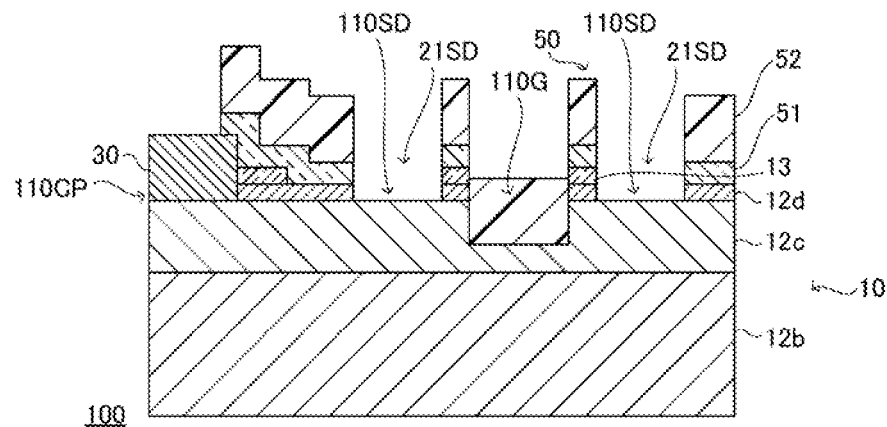

FIG. 3C is used for reference. The cap layer 12d of the region 21SD is etched by PEC etching, with the resist mask 52 (and the hard mask 51 and the insulating film 13 interposed under the resist mask 52) used as the mask 50, to thereby form the ohmic recess 110SD. Thereafter, the resist mask 52 is removed.

Figure 4A:
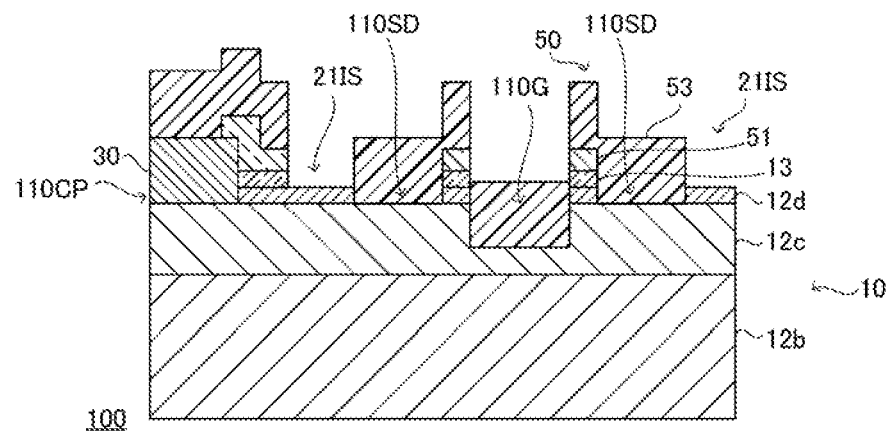
FIGS. 4A to 4C are schematic cross-sectional views illustrating HEMT manufacturing steps according to the present embodiment.

FIG. 4A is used for reference. A resist mask 53 having an opening on the region 21IS is formed. The gate recess 110G and the ohmic recess 110SD are filled with the resist mask 53, to cover an entire upper surface of the cathode pad 30.

Figure 4B:
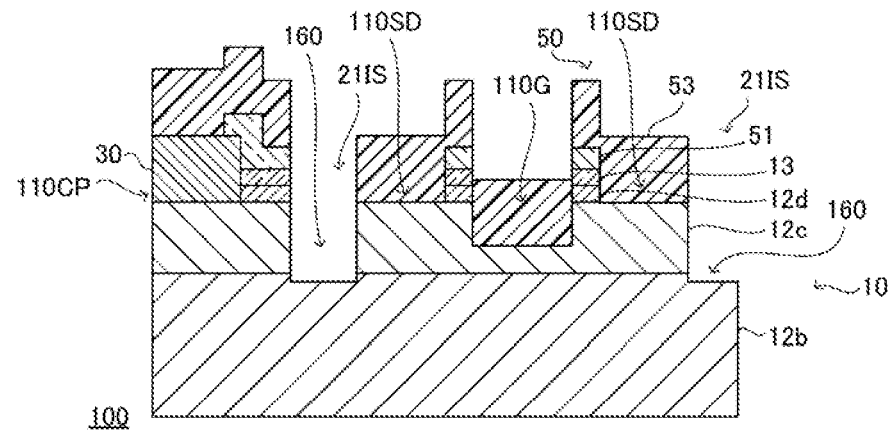

FIG. 4B is used for reference. The element separation structure 160, which is an element separation groove, is formed by etching the cap layer 12d, the barrier layer 12c, and the channel layer 12b of the region 21IS, with the resist mask 53 (and the hard mask 51 and the insulating film 13 interposed under the resist mask 53) used as the mask 50. For the etching to form the element separation structure 160, for example, dry etching such as inductively coupled plasma reactive ion etching is used. The device separation structure 160 may be formed by ion implantation into the epi layer 12 instead of etching the epi layer 12.

Figure 4C:
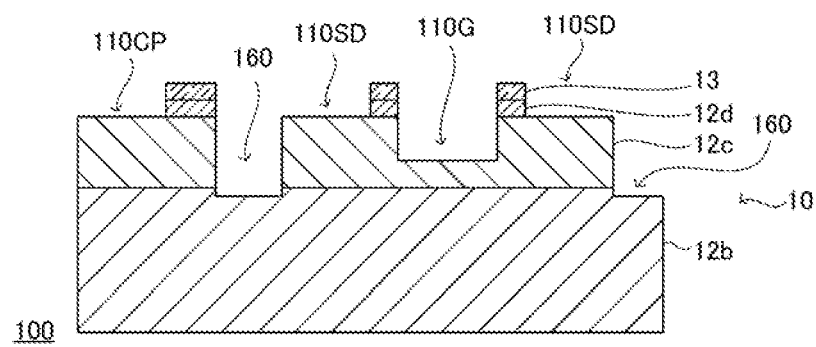

FIG. 4C is used for reference. The resist mask 53 and the hard mask 51 are removed. Further, for example, the processing object 100 is washed with a mixed aqueous solution (hydrochloric acid excess water) of hydrochloric acid (HCl) and hydrogen peroxide ($H_2O_2$). For example, the cathode pad 30 can be removed by washing with hydrochloric acid hydrogen peroxide.

As described above, dislocations are distributed at a predetermined density on the upper surface of the epi layer 12. Since a lifetime of the holes is short in dislocations, PEC etching is unlikely to occur. Therefore, convex portions are likely to be formed as undissolved portions of the PEC etching, at positions corresponding to dislocations, at the bottom of the gate recess 110G and ohmic recess 110SD formed by the PEC etching.

According to the findings obtained by the inventor of the present application, for example, washing with hydrogen peroxide can be used to etch the convex portion, that is, to improve the flatness of the bottoms of the gate recess 110G and the ohmic recess 110SD. Thus, in the present embodiment, the washing treatment performed after the formation of the element separation structure 160 also serves as a removal treatment of the cathode pad 30 and a flattening treatment of the bottoms of the gate recess 110G and the ohmic recess 110SD.

Such a washing treatment may be performed using hydrochloric acid (HCl) aqueous solution, mixed aqueous solution (piranha solution) of sulfuric acid ($H_2SO_4$) and hydrogen peroxide ($H_2O_2$), tetramethylammonium hydroxide (TMAH) aqueous solution, hydrogen fluoride aqueous solution (hydrofluoric acid), and potassium hydroxide (KOH) aqueous solution, etc., other than the hydrochloric acid hydrogen peroxide.

Figure 5A:
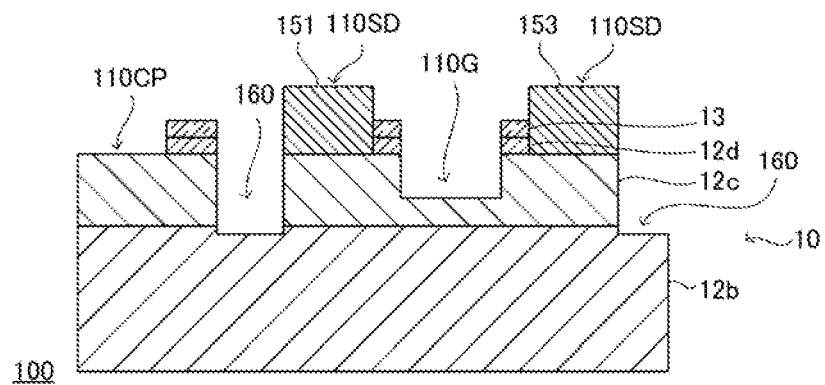
FIGS. 5A to 5C are schematic cross-sectional views illustrating HEMT manufacturing steps according to the present embodiment.

FIG. 5A is used for reference. The source electrode 151 and the drain electrode 153 are formed by lift-off using a resist mask having an opening on the ohmic recess 110SD.

The source electrode 151 and the drain electrode 153 are formed of, for example, a Ti/Al/Ti/Au layer.

Figure 5B:
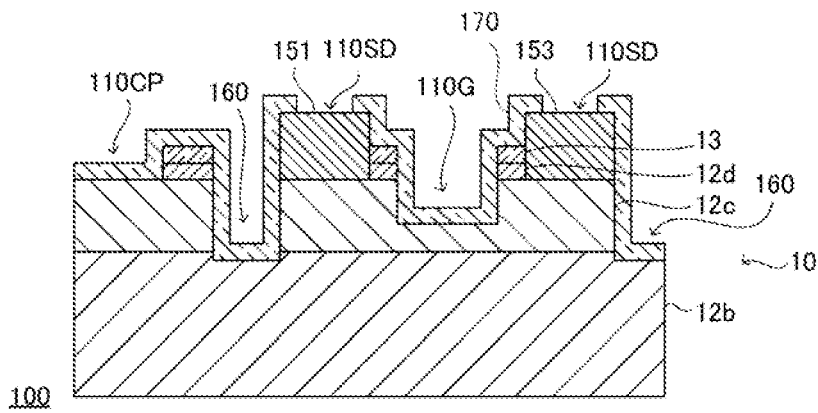

FIG. 5B is used for reference. For example, an aluminum oxide film is deposited on the entire upper surface of the processing object 100. The insulating film 170 is formed by removing a portion of the aluminum oxide film arranged on the upper surface of the source electrode 151 and the drain electrode 153 by photolithography and etching. For the etching of the silicon oxide film, for example, a buffered hydrofluoric acid aqueous solution is used.

Figure 5C:
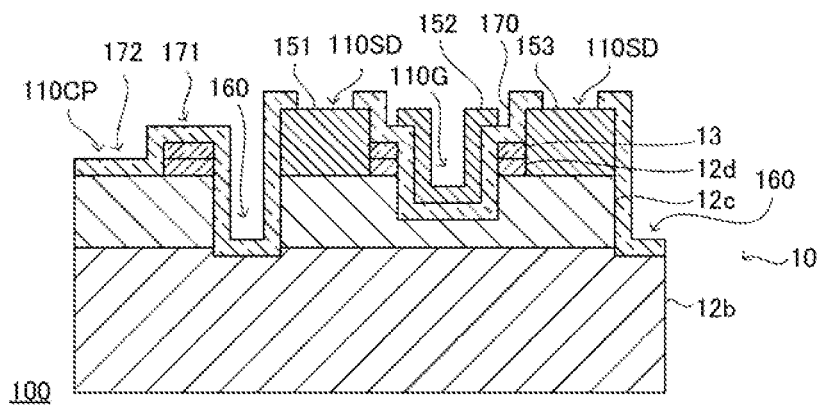

FIG. 5C is used for reference. The gate electrode 152 is formed by lift-off using the resist mask having an opening on the gate recess 110G. The gate electrode 152 is formed of, for example, a Ni/Au layer. The gate electrode 152 is formed on the gate recess 110G through the insulating film 170 which is a gate insulating film. As described above, the HEMT150 is manufactured.

Figure 6A:
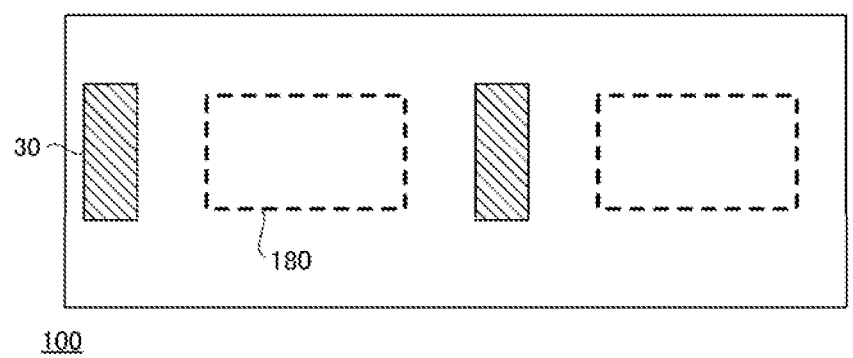
FIGS. 6A and 6B are schematic plan views illustrating HEMT manufacturing steps according to the present embodiment.

FIG. 6A is a schematic plan view corresponding to FIG. 2B, and illustrates a planar arrangement example of the cathode pad 30. As illustrated in FIGS. 2B and 6A, the cathode pad 30 is provided outside the element region 180 of the HEMT 150 (in plan view) on the laminate 10.

Figure 6B:
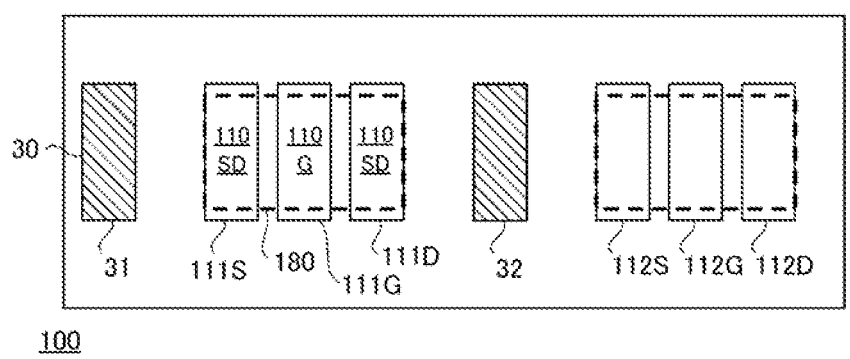

FIG. 6B is a schematic plan view corresponding to FIG. 3C, and illustrates a planar arrangement example of the gate recess 110G and the ohmic recess 110SD.

According to the present embodiment, the cathode pad 30 is provided outside the element region 180. By using the cathode pad 30 provided in this way, the ohmic recess 110SD can be formed by PEC etching. Further, by providing the cathode pad 30 outside the element region 180, the degree of freedom in the shape, arrangement, etc. of the cathode pad 30 can be increased. Such a cathode pad 30 can also be used for forming the gate recess 110G by PEC etching.

In this example, more specifically, the cathode pad 30 is arranged between the HEMT elements adjacent to each other in a gate length direction (left-right direction on a paper surface). For example, as illustrated in FIG. 6B, a certain cathode pad 32 is arranged between a drain recess 111D of the first HEMT element on the left side of the paper, and a source recess 112S of the second HEMT element (HEMT element on the right side of the paper) adjacent to the first HEMT element.

Thereby, for example, the cathode pad 30 can be provided at equal positions from the drain recess 111D of the first HEMT element and the source recess 112S of the second HEMT element, and therefore it becomes easy to improve the uniformity of PEC etching conditions for forming both recesses.

Further in this example, the cathode pad 30 has a shape extending in the gate width direction (paper surface vertical direction), that is, a shape extending in a direction parallel to a length direction of the ohmic recess 110SD.

Thereby, for example, it is easy to improve the uniformity of the PEC etching conditions in the length direction of the Ohmic recess 110SD.

The present embodiment is an embodiment in which the ohmic recess 110SD is formed after forming the gate recess 110G. Due to the formation of the gate recess 110G, the cap layer 12d of the portion of the gate recess 110G is removed, and the 2DEG under the gate recess 110G is reduced.

Due to this, the source recess 110s and the drain recess 1101D of the same HEMT element are less likely to conduct with the same cathode pad 30. For example, as illustrated in FIG. 6B, the cathode pad 31 arranged on the source recess 111S side of the first HEMT element is difficult to conduct with the drain recess 111D arranged on the side opposite to the cathode pad 31 with respect to the gate recess 111G.

However, the drain recess 111D of the first HEMT element can easily conduct with the cathode pad 32 arranged on the same side as the drain recess 111D with respect to the gate recess 111G. Further, similarly, the source recess 112S of the second HEMT element can easily conduct with the cathode pad 32 arranged on the same side as the source recess 112S with respect to the gate recess 112G.

Thus, in this example, since the cathode pad 30 arranged between the HEMT elements adjacent to each other in the gate length direction is shared in the PEC etching for forming the ohmic recess 110SD of these HEMT elements, the formation of the ohmic recess 110SD can be performed well. Thereby, for example, it is possible to improve the uniformity of the PEC etching conditions in the HEMT elements adjacent to each other in the gate length direction, and to facilitate the formation of the ohmic recess 110SD after forming the gate recess 110G.

Figure 7A:
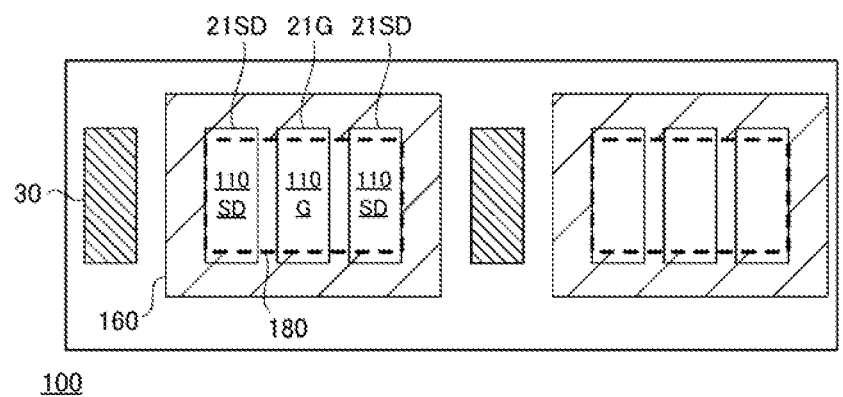
FIGS. 7A and 7B are schematic plan views illustrating HEMT manufacturing steps according to the present embodiment.

FIG. 7A is a schematic plan view corresponding to FIG. 4B, and illustrates an example of a planar arrangement of the element separation structure 160. The element separation structure 160 defines an element region 180 that functions as a HEMT element. In a plan view, the element region 180 is an internal region of a closed edge (HEMT element side, that is, an inner edge shown by a thick broken line) surrounding the HEMT element of the element separation structure 160.

The present embodiment is an embodiment in which the element separation structure 160 is formed with the cathode pad 30 provided. The cathode pad 30 functions as at least a part of the mask 50 when forming the element separation structure 160 (when performing dry etching, ion implantation, etc.). Therefore, in this example, the element separation structure 160 is formed so as not to overlap (in a plan view) with the arrangement region of the cathode pad 30.

In the embodiment in which the element separation structure 160 is formed with the cathode pad 30 provided, it is preferable to perform dry etching to form the element separation structure 160, in a state of forming a mask (resist mask 53) that covers the cathode pad 30 so as not to be exposed (see FIG. 4B). Thereby, it is possible to suppress etching of the cathode pad 30 by the dry etching, and suppress unnecessary contamination caused by a material (for example, a metal such as Ti) constituting the cathode pad 30.

In the element separation structure 160, the 2DEG is divided, and the conduction by the cap layer 12d is also lost. Therefore, after the element separation structure 160 is formed, the ohmic recess 110SD (or gate recess 110G) arranged in the device region 180 cannot be formed by the PEC etching using the cathode pad 30 provided outside the device region 180.

Therefore, according to the present embodiment, the element separation structure 160 is formed after forming the ohmic recess 110SD (and gate recess 110G) by PEC etching using the cathode pad 30 provided outside the device region 180.

Figure 7B:
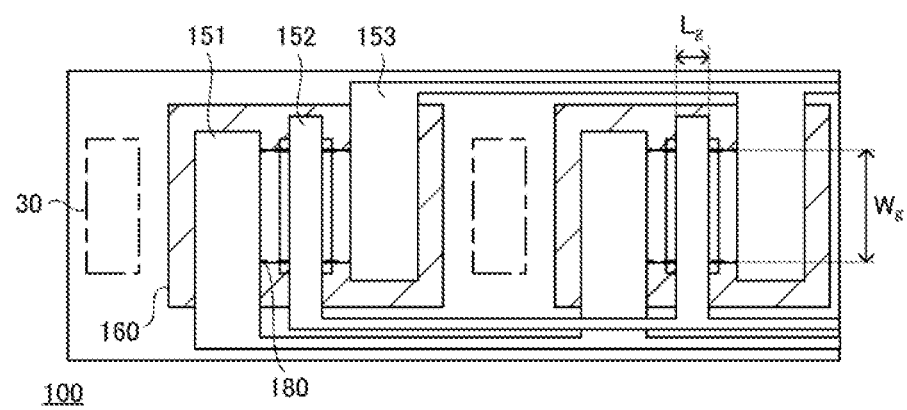

FIG. 7B is a schematic plan view corresponding to FIG. 5C, and illustrates a planar arrangement example of the source electrode 151, the gate electrode 152, and the drain electrode 153. A gate length Lg of the HEMT element is defined by a width of the gate electrode 152. The source electrode 151, the gate electrode 152, and the drain electrode 153 are arranged side by side in a gate length direction. A direction orthogonal to the gate length direction is the gate width direction, and a gate width Wg is defined by a length of the element region 180 in the gate width direction. The source electrodes 151, the gate electrodes 152, and the drain electrodes 153 may be electrically connected to each other between adjacent HEMT elements, if necessary.

According to the present embodiment, both the etching for forming the gate recess 110G and the etching for forming the ohmic recess 110SD are performed by PEC etching. Hereinafter, the PEC etching for forming the gate recess 110G is also referred to as a PEC etching for the gate recess 110G, and the PEC etching for forming the ohmic recess 110SD is also referred to as a PEC etching for forming the Ohmic recess 110SD.

The light source 220 may be switched (the wavelength characteristic of the light 221 may be changed) for each of the PEC etching for the gate recess 110G and the PEC etching for the ohmic recess 110SD. However, it is preferable to use the same light source 220 (light 221 having the same wavelength properties) for both PEC etchings, from a viewpoint of simplifying the structure of the PEC etching apparatus 200.

In the example in which the cap layer 12d is made of GaN and the barrier layer 12c is made of AlGaN, the cap layer 12d (GaN) can also be PEC-etched by the short-wavelength light 221 capable of PEC-etching the barrier layer 12c (AlGaN).

The PEC etching for the gate recess 110G can be stopped by self-stop as described above. On the other hand, when performing PEC etching for the ohmic recess 110SD using such short wavelength light 221, etching will proceed deeply until it stops by itself if no time limit is set. Therefore, the PEC etching for the ohmic recess 110SD is stopped by time control. Thereby, both PEC etchings can be performed using the same light source 220.

In PEC etching for the ohmic recess 110SD, etching may be stopped when a total thickness of the cap layer 12d is etched by using a long wavelength light 221 possible to PEC-etch the cap layer 12d but not possible to PEC-etch the barrier layer 12c.

The time required for the PEC etching for the gate recess 110G is longer than the time required for the PEC etching for the ohmic recess 110SD, which is shallower than the PEC etching for the gate recess 110G. According to the present embodiment, the PEC etching for the gate recess 110G, which takes a long time, is performed using a hard mask 51. PEC etching for gate recess 110G may be performed using a resist mask (only). However, it is preferable to use the hard mask 51 for the PEC etching for the gate recess 110G in order to further improve a resistance of the mask to the etching solution 201 and further improve patterning accuracy.

According to the present embodiment, after the PEC etching for the gate recess 110G, the PEC etching for the ohmic recess 110SD is performed. During the PEC etching for the gate recess 110G, the cap layer 12d of the region 21SD corresponding to the ohmic recess 110SD is in a state of being protected by the hard mask 51 (see FIG. 3A). Thereby, unnecessary etching of the cap layer 12d of the region 21 SD can be further suppressed as compared with a state in which the cap layer 12d is protected by a resist mask (only).

The PEC etching for the ohmic recess 110SD is performed using the hard mask 51 having an opening formed on the region 21 SD and a resist mask 52, and is performed in a state where the gate recess 110G is filled with the resist mask 52, preferably at least the resist mask 52 covers a side surface of the gate recess 110G made of Group III nitride (see FIG. 3C). Since the side surface of the gate recess 110G is protected by the resist mask 52, unnecessary side etching of the side surface can be suppressed in the PEC etching for the ohmic recess 110SD. In this example, the gate recess 110G is protected only by the resist mask during the PEC etching for the ohmic recess 110SD. However, the time required for the PEC etching for the ohmic recess 110SD is short, and therefore a problem is unlikely to occur.

It is no problem whichever the PEC etching for the gate recess 110G or the PEC etching for the ohmic recess 110SD is performed first, depending on a situation.

Further, whichever the resist mask or the hard mask may be used to perform the PEC etching for the gate recess 110G and the PEC etching for the ohmic recess 110SD, depending on a situation.

The HEMT 150 according to the present embodiment has the following features for example, reflecting the above-described manufacturing method.

In the manufacturing method according to the present embodiment, the source recess 110S and the drain recess 1101D (and further the gate recess 110G) can be formed by PEC etching. Therefore, a plasma damage that would be introduced when the source recess and drain recess are formed by conventional dry etching, is not introduced into the HEMT 150 of the present embodiment. That is, in the HEMT150 of the present embodiment, no plasma damage has been introduced into the Group III nitride layer located at least directly under the source and drain electrodes (more preferably, also in the Group III nitride layer directly under the gate electrode).

In the manufacturing method of the present embodiment, the source recess 110S and drain recess 110D (and further the gate recess 110G) are formed by PEC etching using the cathode pad 30 provided outside the element separation structure 160. In an arrangement region of the cathode pad 30, the cap layer 12d is removed to form the recess 110CP.

Reflecting this, as illustrated in FIG. 5C, the insulating film 170 of the HEMT 150 may have a portion 171 provided on the barrier layer 12c through the cap layer 12d and a portion 172 provided directly above the barrier layer 12c, outside the element separation structure 160 with respect to the region where the source electrode 151, the gate electrode 152, and the drain electrode 153 are arranged.

First Modified Example

Figure 9A:
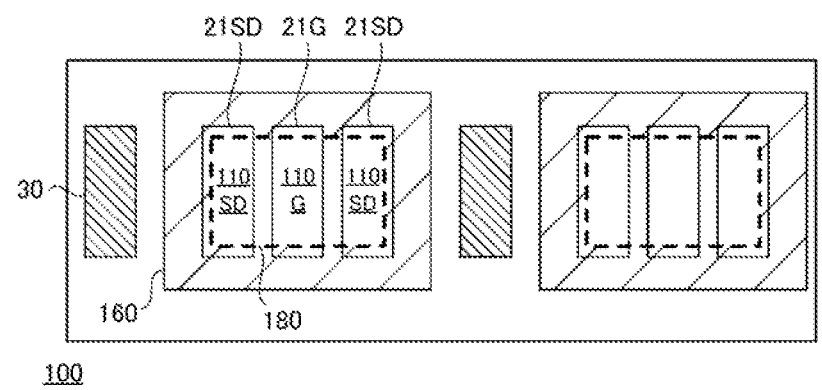
FIG. 9A is a schematic plan view illustrating a planar arrangement example of an element separation structure according to a first modified example.

A first modified example will be described. FIG. 9A is a schematic plan view illustrating a planar arrangement example of the element separation structure 160 according to a first modified example. As illustrated in FIG. 9A, the element separation structure 160 may be formed so that at least one end in the gate width direction and the gate length direction of the region 21SD to be etched in which the ohmic recess 110SD is formed, and the element separation structure 160 are overlapped (in plan view). That is, the device separation structure 160 may be formed so as to have an overlap (in plan view) with a part of the region 21SD to be etched in which the ohmic recess 110SD is formed.

Thereby, it is possible to more ensure that the ohmic recess 110SD is arranged without a gap so as to extend to the end of the element region 180 in the gate width direction or the gate length direction. That is, the region 21SD to be etched may be defined so as to be slightly wider than an effective recess portion that is arranged in the element region 180 and actually functions as the ohmic recess 110SD.

Second Modified Example

Figure 9B:
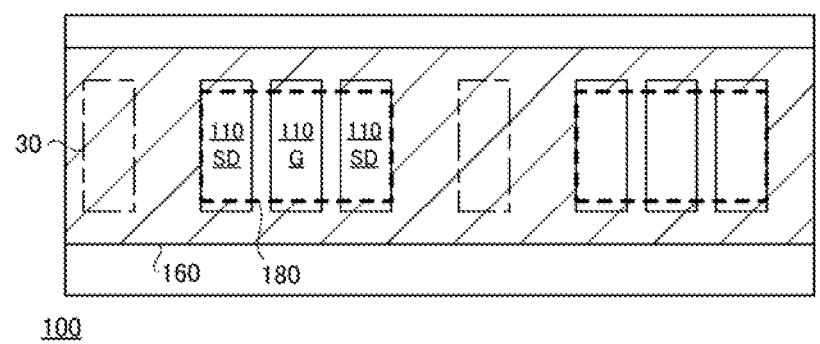
FIG. 9B is a schematic plan view illustrating a planar arrangement example of an element separation structure 160 according to a second modified example.

A second modified example will be described. FIG. 9B is a schematic plan view illustrating a planar arrangement example of the element separation structure 160 according to a second modified example. The above-described embodiment is an embodiment in which the element separation structure 160 is formed so as not to overlap with the arrangement region of the cathode pad 30 (in a plan view). As illustrated in FIG. 9B, the element separation structure 160 may be formed so as to have an overlap (in a plan view) with the arrangement region of the cathode pad 30.

Figure 10A:
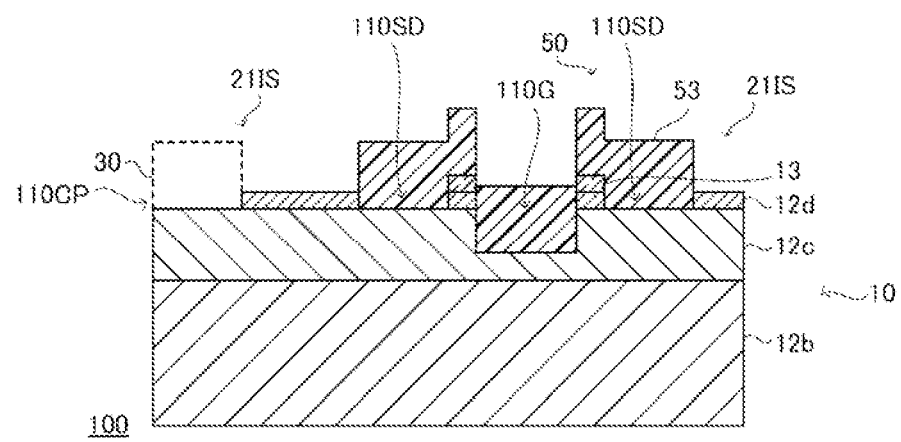
FIGS. 10A and 10B are schematic cross-sectional views illustrating HEMT manufacturing steps according to a second modified example.
Figure 10B:
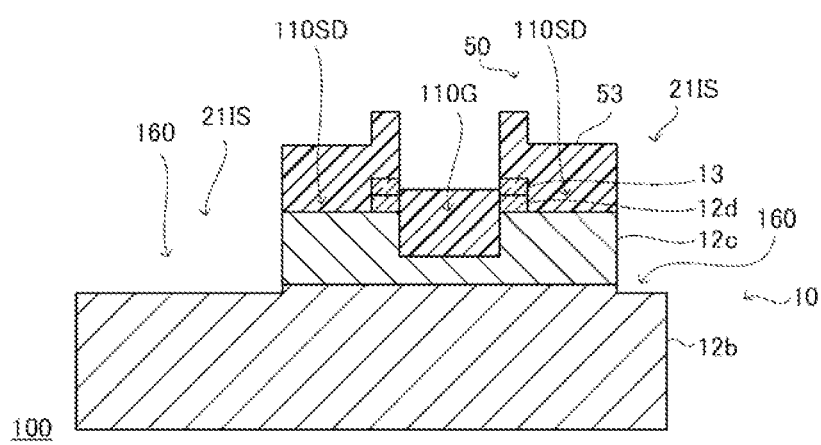

FIGS. 10A and 10B are schematic cross-sectional views illustrating a manufacturing step of the HEMT150 according to a second modified example. In this modified example, as illustrated in FIG. 10A, the cathode pad is removed after the ohmic recess 110SD (and gate recess 110G) is formed and before the device separation structure 160 is formed. The cathode pad 30 is removed, for example, by hydrochloric acid hydrogen peroxide.

After the cathode pad 30 is removed, the element separation structure 160 is formed in a region overlapping with the arrangement region of the cathode pad 30 as illustrated in FIG. 10B. Since the cathode pad 30 is removed, the element separation structure 160 can be formed also in the arrangement region of the cathode pad 30.

As in the above embodiment, in a structure in which the arrangement region of the cathode pad 30 and the element separation structure 160 do not overlap, that is, the arrangement region of the cathode pad 30 is provided outside the element separation structure 160, the arrangement region of the cathode pad 30 cannot be effectively utilized as, for example, the element separation structure 160. In this modified example, since the element separation structure 160 is formed after removing the cathode pad 30, the arrangement region of the cathode pad 30 can be effectively utilized.

Third Modified Example

Figure 11:
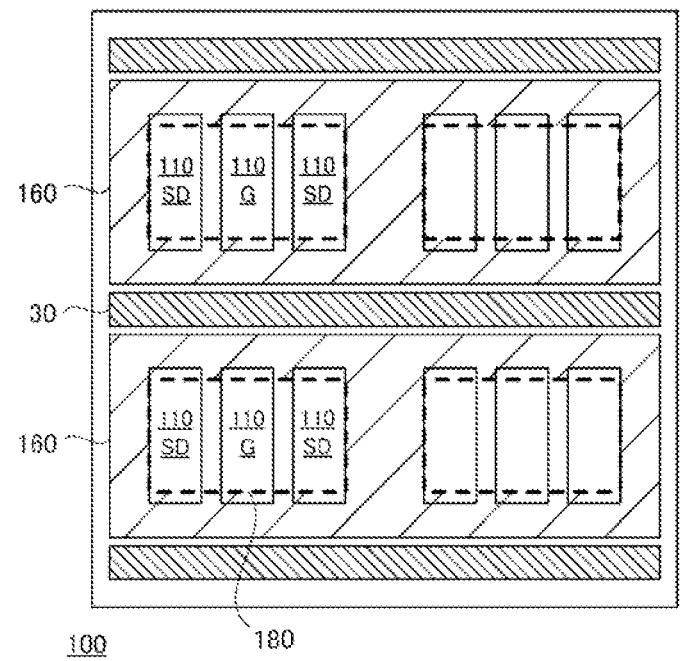
FIG. 11 is a schematic plan view illustrating a planar arrangement example of a cathode pad according to a third modified example.

A third modified example will be described. FIG. 11 is a schematic plan view illustrating a planar arrangement example of the cathode pad 30 according to the third modification. The above-described embodiment is an embodiment in which the cathode pad 30 is arranged between the HEMT elements adjacent to each other in the gate length direction.

As illustrated in FIG. 11, The cathode pad 30 may be arranged between the HEMT elements adjacent to each other in the gate width direction. The cathode pad 30 has, for example, a shape extending in the gate length direction, that is, a shape extending in a direction orthogonal to a length direction of the ohmic recess 110SD. Owing to the cathode pad 30 of this modified example, for example the uniformity of the PEC etching conditions in the HEMT elements adjacent to each other in the gate width direction, can be improved.

Fourth Modified Example

Figure 12:
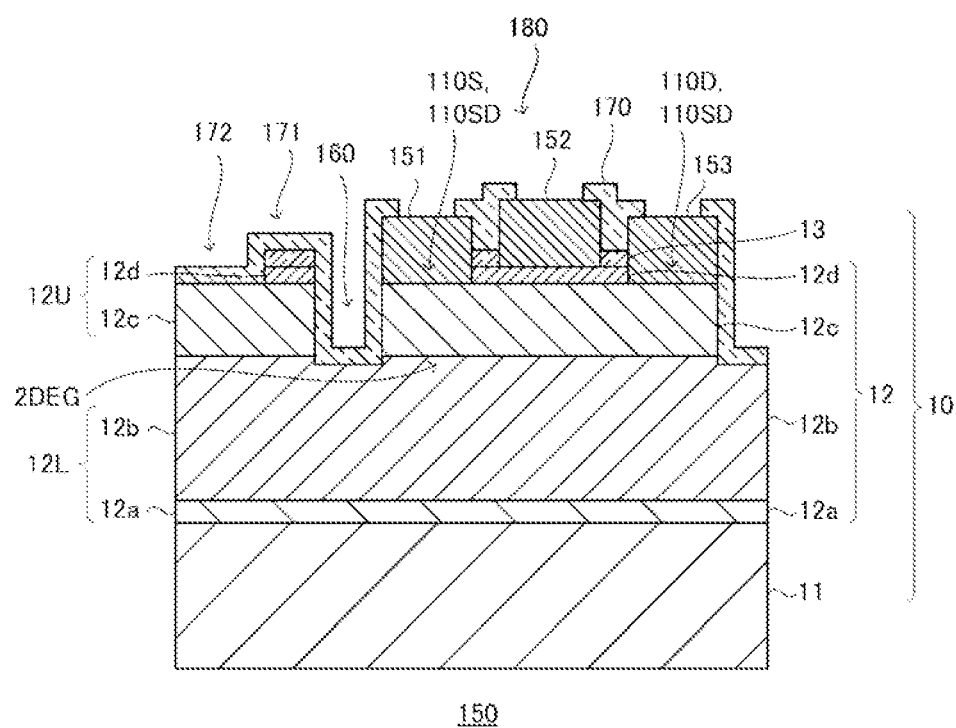
FIG. 12 is a schematic cross-sectional view illustrating HEMT according to a fourth modified example.

A fourth modified example will be described. FIG. 12 is a schematic cross-sectional view illustrating HEMT 150 according to the fourth modified example. The above embodiment (see FIG. 1) is an embodiment in which the gate recess 110G is also formed by PEC etching, together with the ohmic recess 110SD. The fourth modified example is an example in which the gate recess 110G is not formed.

As illustrated in FIG. 12, the HEMT 150 according to this modified example has the ohmic recess 110SD but does not have the gate recess. The gate electrode 152 is formed on, for example, the cap layer 12d. Further in this modified example, no gate insulating film is interposed under the gate electrode 152.

For example, even in the HEMT150 of such an embodiment, similarly to the above-described embodiment, the ohmic recess 110SD can be formed by PEC etching using the cathode pad 30 provided outside the element region 180.

Other Embodiments

As described above, the embodiments and modified examples of the present disclosure have been specifically described. However, the present disclosure is not limited to the above-described embodiments and modified examples, and various modifications, improvements, combinations, and the like can be made without departing from the gist thereof. The above-described embodiment and various modified examples, as well as other embodiments described below, may be used in combination as appropriate.

The above-described embodiments show that dry etching is used as the etching to form the element separation structure 160 which is an element separation groove. However, PEC etching, which is a wet etching, may also be used as the etching.

It is found by the present inventors that in order to self-stop the PEC etching by reducing 2DEG, that is, to stop the PEC etching at a depth in the middle of the barrier layer 12c, it is preferable to make the etching solution 201 acidic. In other words, by making the etching solution 201 alkaline, although the mechanism is unknown, (high-speed) PEC etching that penetrates the barrier layer 12c and reaches a depth in the middle of the channel layer 12b is likely to occur.

From the above finding, it is preferable to use the etching solution 201 that is acidic (from the start of the PEC etching), for the PEC etching for forming the gate recess 110G and the ohmic recess 110SD. Further, by using the alkaline etching solution 201, it is possible to form the element separation structure 160, which is an element separation groove, by PEC etching.

Figure 13:
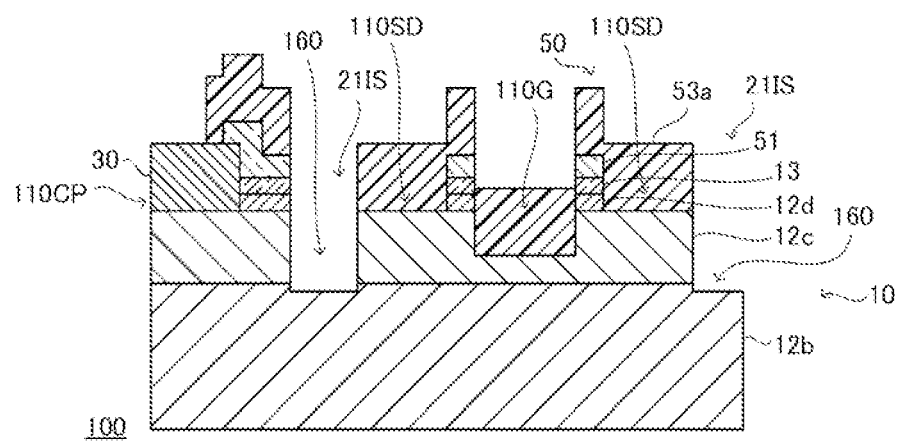
FIG. 13 is a schematic cross-sectional view illustrating the steps of another embodiment in which the element separation structure is formed by PEC etching.

FIG. 13 is a schematic cross-sectional view illustrating a step of forming the element separation structure 160 by PEC etching (corresponding to FIG. 4B described above). In the example illustrated in FIG. 13, a mask 53a that exposes at least a part of the cathode pad 30 is formed in order to perform PEC etching. In this step, the device separation structure 160 is formed by performing PEC etching at a depth at which the channel layer 12b is exposed on the bottom, using the alkaline etching solution 201. In contrast, in the steps shown in FIGS. 3A and 3C, the gate recess 110G and the ohmic recess 110SD are formed by performing PEC etching at a depth at which the barrier layer 12c is exposed on the bottom, preferably using the acidic etching solution 201 respectively.

In the above-described embodiments, the cathode pad 30 provided outside the element region 180 has been described. However, a part of the cathode pad 30 may have an overlap (in plan view) with the element region 180.

Figure 14:
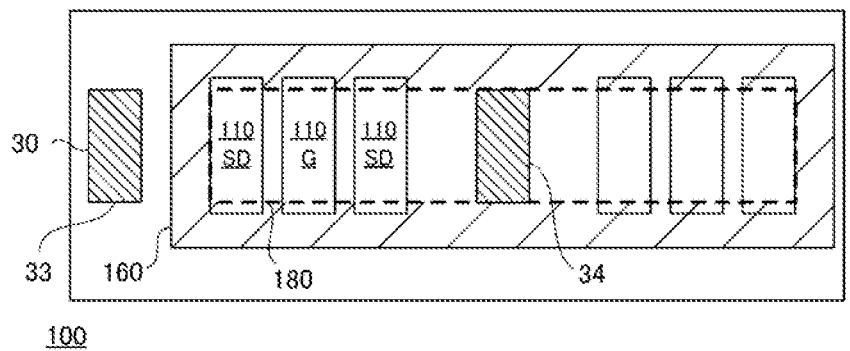
FIG. 14 is a schematic plan view illustrating another embodiment in which a part of a cathode pad overlaps with a device region.

FIG. 14 is a schematic plan view illustrating an embodiment in which a part of the cathode pad 30 overlaps with the element region 180. In the example illustrated in FIG. 14, two HEMT elements are arranged side by side in the gate length direction, and these two HEMT elements are formed in a common element region 180. That is, these two HEMT elements are surrounded by a common element separation structure 160.

In this example, the cathode pad 33 arranged on the left side of the HEMT element on the left side of the paper surface is provided outside the element region 180, and the cathode pad 34 arranged between the two HEMT elements has an overlap with the element region 180.

The above-described embodiment is an embodiment in which a conductive member that is separate from the laminate (nitride semiconductor crystal substrate) 10 is used as the cathode pad (conductive member that functions as a cathode for electrodeless PEC etching) 30. However, as described below, a conductive member (conductive region) composed of a group III nitride as a part of the laminate 10 may be used as the cathode pad 30.

When comprehensively considering a case where a conductive member different from the laminate 10 is used as the cathode pad 30, and a case where a conductive member composed of a group III nitride is used as a part of the laminate 10, the expression of the cathode portion 30 may be used instead of the expression of the cathode pad 30.

Figure 15A:
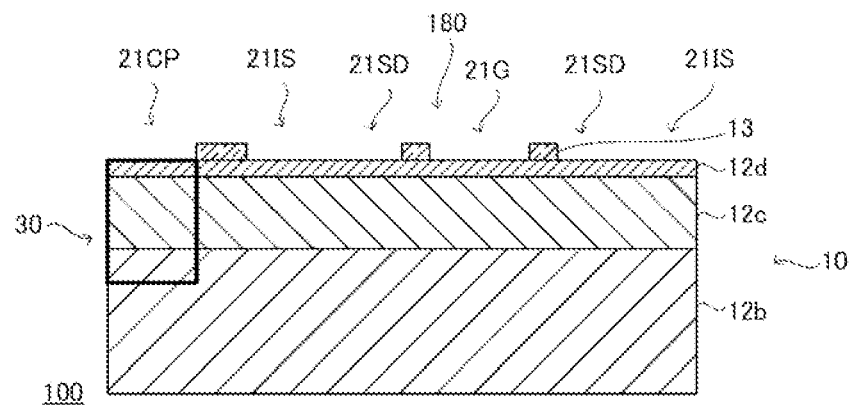
FIGS. 15A and 15B are schematic cross-sectional views illustrating HEMT manufacturing steps according to another embodiment in which the cathode pad (cathode portion) is composed of a Group III nitride, respectively, and are schematic cross-sectional views illustrating the HEMT.
Figure 15B:
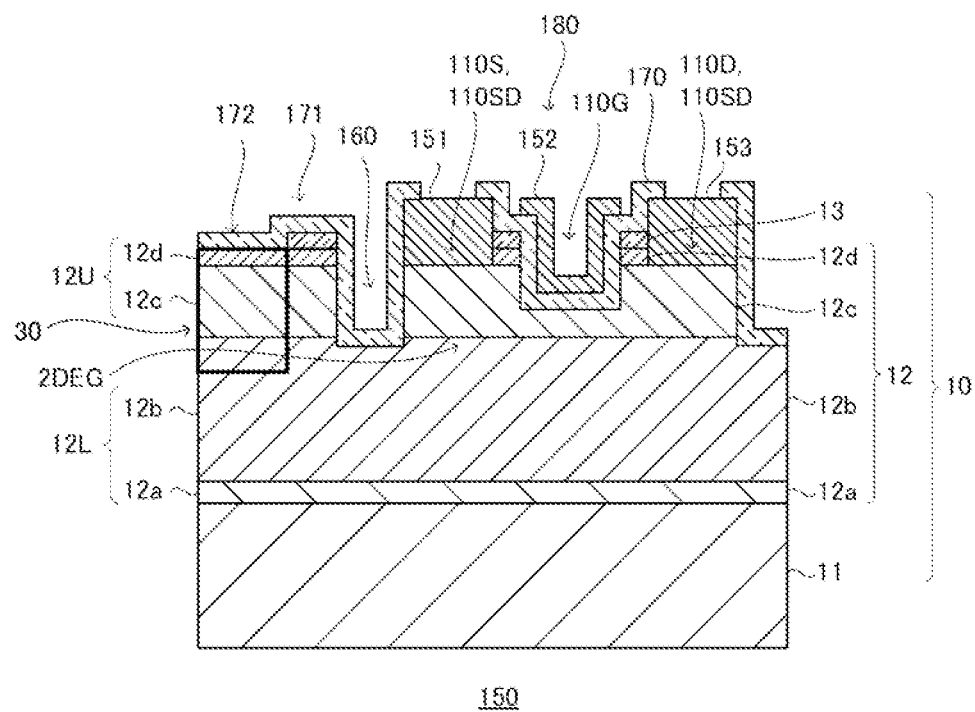

FIGS. 15A and 15B are schematic cross-sectional views illustrating an embodiment in which the cathode portion 30 is formed by ion-implanting an n-type impurity into the epi layer 12.

FIG. 15A corresponds to FIG. 2B of the above-described embodiment and illustrates a step of forming the cathode portion 30. In FIG. 15A, a region that becomes the cathode portion 30 is shown by a thick line. In this example, the region in which the cathode portion 30 is arranged in a plan view is referred to as a region 21CP.

The cathode portion 30 is formed by ion-implanting an n-type impurity such as Si into the epi layer 12, by ion-implanting the n-type impurity such as Si into the epi layer 12 in a state where a mask having an opening is formed in the region 21CP. For example, ion implantation is performed so that the cathode portion 30 having an n-type impurity concentration of $1 \times 10^{17}$ cm$^{-3}$ or more and $1 \times 10^{19}$ cm$^{-3}$ or less and a depth (thickness) of 100 nm or more and 200 nm or less is formed. For example, in the region 21CP, the cathode portion 30 is formed by ion-implanting the n-type impurity to a total thickness of the cap layer 12d, a total thickness of the barrier layer 12c, and an upper part of the channel layer 12b.

The cathode portion 30 reaches 2DEG because it is formed to a depth that reaches the upper part of the channel layer 12b, and the region 21 to be etched, which is etched by PEC etching, and the cathode portion 30 are electrically connected through at least one of the cap layer 12d and 2DEG. In this example, since the cathode portion 30 is directly connected to the 2DEG, electrons can be emitted from the cathode portion 30 more effectively.

In this example, the region 21 to be etched and the cathode portion 30 are both composed of group III nitride. Further, when the region 21 to be etched is irradiated with the light 221, the cathode portion 30 is also irradiated with the light 221. However, the group III nitride constituting the cathode portion 30 has an n-type impurity concentration higher than that of the region 21 to be etched (preferably, for example, 10 times or more higher). Thereby, in the cathode portion 30 having a higher electron concentration than the region 21 to be etched, an anodizing reaction can be suppressed by consuming photoexcited holes in a short time, and therefore the cathode portion 30 is suppressed from being PEC-etched and can function as a cathode for PEC etching. This also applies to the embodiment in which the cathode portion 30 is formed by regrowth described later.

It can be said that the region 21 to be etched by PEC etching is a cap layer 12d or a barrier layer 12c, which is a portion of the epi layer 12 above a lower surface of the barrier layer 12c. Typically, the n-type impurity is not added to the barrier layer 12c, and the n-type impurity is added to the cap layer 12d. The n-type impurity is added so that the cathode portion 30 has an n-type impurity concentration higher than that of the cap layer 12d, that is, an n-type impurity concentration higher than a highest n-type impurity concentration in the region 21 to be etched (preferably, for example, 10 times or more higher).

The step after forming the cathode portion 30 is the same as that of the above-described embodiment. During the PEC etching of the region 21 to be etched, by bringing the cathode portion 30 into contact with the etching solution 201, the cathode portion 30 functions as a cathode for PEC etching. The cathode portion 30 (the group III nitride layer constituting the cathode portion 30) may not be removed and may remain after the formation of the device separation region 160. The cathode portion 30 may be removed by etching at the time of forming the element separation region 160 which is an element separation groove. The cathode portion 30 may be ion-implanted for element separation when the element separation region 160 is formed by ion implantation.

FIG. 15B corresponds to FIG. 1A of the above-described embodiment and schematically illustrates the HEMT150 of this example. The epi layer 12 of the HEMT 150 of this example may have the cathode portion 30 having a depth reaching the upper part of the channel layer 12b outside the element region 180 in a plan view, reflecting the above-described manufacturing method. The cathode portion 30 has an n-type impurity concentration higher than a (highest) n-type impurity concentration in the portion above the lower surface of the barrier layer 12c in the epi layer 12 in the device region 180 in a plan view.

Figure 16:
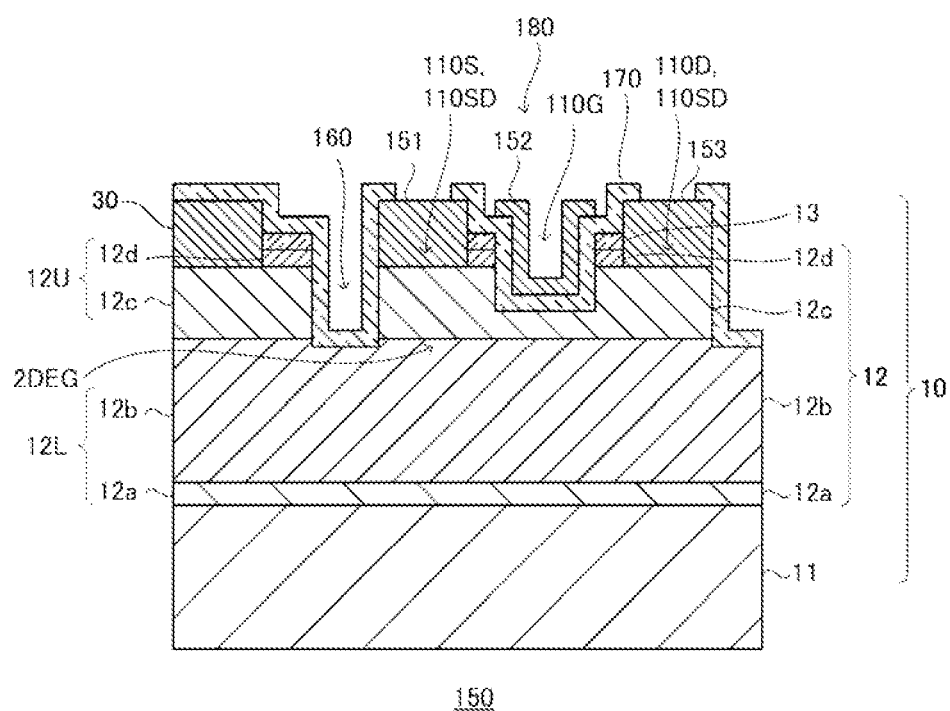
FIG. 16 is a schematic cross-sectional view illustrating a HEMT according to still another embodiment in which the cathode pad (cathode portion) is composed of a Group III nitride.

FIG. 16 is a schematic cross-sectional view illustrating an embodiment in which the cathode portion 30 is formed by regrowth of the group III nitride layer to which the n-type impurity is added. This example may be regarded as an embodiment in which, for example, the cathode portion 30 made of Ti in the above-described embodiment is composed of a group III nitride having a high n-type impurity concentration instead of Ti.

A method of forming the cathode portion 30 of this example will be described with reference to FIG. 2B. The cathode portion 30 is formed by regrowth of GaN to which the n-type impurity such as Si is added above the barrier layer 12c in a state where the mask having an opening is formed in the region 21CP. As a method of the regrowth, sputtering, pulsed laser deposition (PLD), organometallic chemical vapor deposition (MOCVD), molecular beam epitaxy (MBE), or the like may be appropriately used. For example, the cathode portion 30 having an n-type impurity concentration of $1 \times 10^{17}$ cm$^{-3}$ or more and $1 \times 10^{19}$ cm$^{-3}$ or less and a thickness of about 50 nm, is grown. The cathode portion 30 may be provided on the cap layer 12d in the same manner as described in the embodiment in which the cathode portion 30 is made of Ti.

The step after forming the cathode pad 30 is the same as that of the above-described embodiment. Also in this example, the cathode portion 30 may not be removed and may remain after the formation of the element separation region 160.

FIG. 16 corresponds to FIG. 1A of the above-described embodiment and schematically illustrates the HEMT150 of this example. The epi layer 12 of the HEMT 150 of this example may have the cathode portion 30 grown above the barrier layer 12c (or above the cap layer 12d) outside the element region 180 in a plan view, reflecting the above-described manufacturing method. The cathode portion 30 has an n-type impurity concentration higher than an n-type impurity concentration in the portion above the lower surface of the barrier layer 12c in the epi layer 12 in the device region 180 in a plan view.

<Preferable Aspects of the Present Disclosure>

Hereinafter, preferable aspects of the present disclosure will be supplementarily described.

(Supplementary Description 1)

There is provided a method for manufacturing a nitride-based high electron mobility transistor, including:

providing a conductive member on a nitride semiconductor crystal substrate, outside an element region of the high electron mobility transistor in a plan view;

forming a mask on the nitride semiconductor crystal substrate, the mask having an opening (and having an opening that exposes the conductive member) in at least one of a source recess etching region where a source recess is formed, which is a recess in which a source electrode of the high electron mobility transistor is arranged, and a drain recess etching region where a drain recess is formed, which is a recess in which a drain electrode of the high electron mobility transistor is arranged;

performing photoelectrochemical etching by irradiating the nitride semiconductor crystal substrate with light to form at least one of a source recess and a drain recess, in a state where the nitride semiconductor crystal substrate on which the conductive member is provided and the mask is formed is in contact with an etching solution containing an oxidizing agent that receives electrons; and forming an element separation structure (that defines the element region) of the high electron mobility transistor (after the photoelectrochemical etching).

(Supplementary Description 2)

There is provided the method for manufacturing a nitride-based high electron mobility transistor according to the supplementary description 1, wherein each of the above steps is performed in an order described in the supplementary description 1.

(Supplementary Description 3)

There is Provided the Method for Manufacturing a Nitride-based high electron mobility transistor according to the supplementary description 1 or 2, wherein the nitride semiconductor crystal substrate includes on the base substrate at least: a channel layer on which two-dimensional electron gas is formed; a barrier layer formed on the channel layer, and a cap layer formed on the barrier layer and which is composed of a group III nitride having a bandgap smaller than that of a group III nitride constituting the barrier layer, and in the photoelectrochemical etching, the cap layer (only) is removed.

(Supplementary Description 4)

There is provided the method for manufacturing a nitride-based high electron mobility transistor according to the supplementary description 3, wherein the conductive member is electrically connected to the source recess etching region or the drain recess etching region, through at least one of the cap layer and the two-dimensional electron gas.

(Supplementary Description 5)

There is provided the method for manufacturing a nitride-based high electron mobility transistor according to any one of the supplementary descriptions 1 to 4, wherein in the formation of the element separation structure, the element separation structure is formed so as to have an overlap in a plan view with at least one part of the source recess etching region and the drain recess etching region.

(Supplementary Description 6)

There is provided the method for manufacturing a nitride-based high electron mobility transistor according to any one of the supplementary descriptions 1 to 5, wherein in the formation of the element separation structure, the element separation structure is formed by any one of the techniques of ion implantation, dry etching, and photoelectrochemical etching.

(Supplementary Description 7)

There is provided the method for manufacturing a nitride-based high electron mobility transistor according to any one of the supplementary descriptions 1 to 6, wherein in the formation of the element separation structure, the element separation structure is formed so as not to have an overlap with an arrangement region of the conductive member in a plan view.

(Supplementary Description 8)

There is provided the method for manufacturing a nitride-based high electron mobility transistor according to any one of the supplementary descriptions 1 to 7, wherein in the formation of the element separation structure, the element separation structure is formed by ion implantation using the conductive member as at least a part of a mask.

(Supplementary Description 9)

There is provided the method for manufacturing a nitride-based high electron mobility transistor according to the supplementary description 7, wherein in the formation of the element separation structure, the element separation structure is formed by dry etching, at least in a state where a mask is formed to cover the source recess or the drain recess and the conductive member so as not to be exposed.

(Supplementary Description 10)

There is provided the method for manufacturing a nitride-based high electron mobility transistor according to the supplementary description 7, wherein in the formation of the element separation structure, the element separation structure is formed, in a state where a mask is formed to expose at least a part of the conductive member.
(Supplementary Description 11)
There is provided the method for manufacturing a nitride-based high electron mobility transistor according to the supplementary description 10, wherein photoelectrochemical etching in the formation of at least one of the source recess and the drain recess is performed using an acidic etching solution, and photoelectrochemical etching in the formation of the element separation structure is performed using an alkaline etching solution.

Preferably, photoelectrochemical etching in the formation of the gate recess of the supplementary description 17 is performed using an acidic etching solution.
(Supplementary Description 12)
There is provided the method for manufacturing a nitride-based high electron mobility transistor according to any one of the supplementary descriptions 1 to 6, wherein in the formation of the element separation structure, the element separation structure is formed so as to have an overlap with an arrangement region of the conductive member in a plan view.
(Supplementary Description 13)
There is provided the method for manufacturing a nitride-based high electron mobility transistor according to the supplementary description 12, wherein the formation of the element separation structure is performed after removing the conductive member.
(Supplementary Description 14)
There is provided the method for manufacturing a nitride-based high electron mobility transistor according to any one of the supplementary descriptions 1 to 13,
wherein in the manufacturing of a nitride-based high electron mobility transistor, a plurality of high electron mobility transistors are manufactured, which are arranged in at least one direction of a gate length direction and a gate width direction on the nitride semiconductor crystal substrate, and
the conductive member is arranged between at least one of the high electron mobility transistor elements adjacent to each other in the gate length direction and the high electron mobility transistor elements adjacent to each other in the gate width direction.

The plurality of conductive members may be arranged side by side in at least one direction of the gate length direction and the gate width direction.
(Supplementary Description 15)
There is provided the method for manufacturing a nitride-based high electron mobility transistor according to the supplementary description 14, wherein the conductive member arranged between the high electron mobility transistor elements adjacent to each other in the gate length direction has a shape extending in the gate width direction.
(Supplementary Description 16)
There is provided the method for manufacturing a nitride-based high electron mobility transistor according to the supplementary description 14 or 15, wherein the conductive member arranged between the high electron mobility transistor elements adjacent to each other in the gate width direction has a shape extending in the gate length direction.
(Supplementary Description 17)
There is provided the method for manufacturing a nitride-based high electron mobility transistor according to any one of the supplementary descriptions 1 to 16, further including:
forming another mask on the nitride semiconductor crystal substrate, the mask having an opening (and an opening that exposes the conductive member) in a gate recess etching region where a gate recess is formed, which is a recess in which a gate electrode of the high electron mobility transistor is arranged;
forming the gate recess by performing other photoelectrochemical etching by irradiating the nitride semiconductor crystal substrate with light, in a state where the nitride semiconductor crystal substrate on which the conductive member is provided and the mask is formed is in contact with an etching solution containing an oxidizing agent that receives electrons; and
forming the element separation structure (after the photoelectrochemical etching and the other photoelectrochemical etching).
(Supplementary Description 18)
There is provided the method for manufacturing a nitride-based high electron mobility transistor according to the supplementary description 17,
wherein the nitride semiconductor crystal substrate includes on a base substrate, at least: a channel layer on which a two-dimensional electron gas is formed, a barrier layer formed on the channel layer, and a cap layer formed on the barrier layer and which is composed of a group III nitride having a bandgap smaller than that of the group III nitride constituting the barrier layer, and
in the photoelectrochemical etching, the cap layer (only) is removed, and in the other photoelectrochemical etching, the cap layer and a part of the barrier layer are removed.
(Supplementary Description 19)
There is provided the method for manufacturing a nitride-based high electron mobility transistor according to the supplementary description 17 or 18,
wherein in the photoelectrochemical etching and the other photoelectrochemical etching, light irradiation is performed using a same light source (light having the same wavelength properties), and
the photoelectrochemical etching is stopped by time control, and the above other photoelectrochemical etching is stopped by self-stop.
(Supplementary Description 20)
There is provided the method for manufacturing a nitride-based high electron mobility transistor according to any one of the supplementary descriptions 17 to 19,
wherein the above other photoelectrochemical etching is performed prior to the photoelectrochemical etching, and
in the above other photoelectrochemical etching, the above other mask is formed using a hard mask made of an inorganic material or a metallic material.
(Supplementary Description 21)
There is provided the method for manufacturing a nitride-based high electron mobility transistor according to any one of the supplementary descriptions 17 to 20,
wherein in the photoelectrochemical etching, the mask is formed using a resist mask.
(Supplementary Description 22)
There is provided a method for manufacturing a nitride-based high electron mobility transistor, including:
providing a conductive member on a nitride semiconductor crystal substrate, outside an element region of the high electron mobility transistor in a plan view;
forming a mask on the nitride semiconductor crystal substrate, the mask having an opening (and having an opening that exposes the conductive member) in a gate recess etching region where a gate recess is formed, which is a recess in which a gate electrode of the high electron mobility transistor is arranged:
performing photoelectrochemical etching by irradiating the nitride semiconductor crystal substrate with light to form the gate recess, in a state where the nitride semiconductor crystal substrate on which the conductive member is provided and the mask is formed is in contact with an etching solution containing an oxidizing agent that receives electrons; and
forming an element separation structure (that defines the element region) of the high electron mobility transistor (after the photoelectrochemical etching).

(Supplementary Description 23)
There is provided a nitride-based high electron mobility transistor, including:
a group III nitride layer having at least a channel layer, a barrier layer arranged on the channel layer, and a cap layer arranged on the barrier layer;
a source electrode, a gate electrode, and a drain electrode; and
an element separation structure,
wherein plasma damage is not introduced into at least a group III nitride layer located directly under the source electrode and the drain electrode.

(Supplementary Description 24)
There is provided a nitride-based high electron mobility transistor, including:
a group III nitride layer having at least a channel layer, a barrier layer arranged on the channel layer, and a cap layer arranged on the barrier layer;
a source electrode, a gate electrode, and a drain electrode; and
an element separation structure,
wherein the insulating film covers the element separation structure and is provided so as to extend to outside of the element separation structure with respect to a region where the source electrode, the gate electrode, and the drain electrode are arranged, and has a portion provided on the barrier layer through the cap layer and a portion provided directly above the barrier layer, outside the element separation structure.

(Supplementary Description 25)
There is provided a method for manufacturing a structure, including:
preparing a processing object including a region to be etched composed of a group III nitride, and a cathode portion composed of a group III nitride having a higher concentration of n-type impurities than the region to be etched and electrically connected to the region to be etched;
etching the region to be etched by irradiating the region to be etched (and the cathode portion) with light in a state where the region to be etched and the cathode portion are in contact with an etching solution containing an oxidizing agent that receives electrons.

(Supplementary Description 26)
There is provided a nitride-based high electron mobility transistor, including:
a group III nitride layer having at least a channel layer and a barrier layer arranged on the channel layer (preferably further having a cap layer arranged on the barrier layer); and
a source electrode, a gate electrode, and a drain electrode; and
an element separation structure,
wherein the group III nitride layer has a cathode portion having a depth reaching an upper part of the channel layer outside an element region of the high electron mobility transistor in a plan view, and
the cathode portion has an n-type impurity concentration higher than the n-type impurity concentration in a portion above a lower surface of the barrier layer in the group III nitride layer in the element region of the high electron mobility transistor in a plan view.

(Supplementary Description 27)
A nitride-based high electron mobility transistor, including:
a group III nitride layer having at least a channel layer and a barrier layer arranged on the channel layer (preferably further having a cap layer arranged on the barrier layer); and
a source electrode, a gate electrode, and a drain electrode; and
an element separation structure,
wherein the group III nitride layer has a cathode portion grown above the barrier layer outside the element region of the high electron mobility transistor in a plan view, and
the cathode portion has an n-type impurity concentration higher than an n-type impurity concentration in a portion above the lower surface of the barrier layer in the group III nitride layer in the element region of the high electron mobility transistor in a plan view.

What is claimed is:

1. A method for manufacturing a nitride-based high electron mobility transistor, comprising:
providing a conductive member on a nitride semiconductor crystal substrate, outside an element region of the high electron mobility transistor in a plan view;
forming a mask on the nitride semiconductor crystal substrate, the mask having an opening in at least one of a source recess etching region where a source recess is formed, which is a recess in which a source electrode of the high electron mobility transistor is arranged, and a drain recess etching region where a drain recess is formed, which is a recess in which a drain electrode of the high electron mobility transistor is arranged;
performing photoelectrochemical etching by irradiating the nitride semiconductor crystal substrate with light to form at least one of a source recess and a drain recess, in a state where the nitride semiconductor crystal substrate on which the conductive member is provided and the mask is formed is in contact with an etching solution containing an oxidizing agent that receives electrons; and
forming an element separation structure of the high electron mobility transistor,
wherein the nitride semiconductor crystal substrate includes on a base substrate, at least: a channel layer on which a two-dimensional electron gas is formed, a barrier layer formed on the channel layer, and a cap layer formed on the barrier layer, which is composed of a group III nitride having a bandgap smaller than that of a group III nitride constituting the barrier layer,
in the photoelectrochemical etching, the cap layer is removed, and
the conductive member is electrically connected to the source recess etching region or the drain recess etching region through at least one of the cap layer and the two-dimensional electron gas.

2. The method for manufacturing a nitride-based high electron mobility transistor according to claim 1, wherein the providing the conductive member, the forming the mask, the forming at least one of the source recess and the drain recess, and the forming the element separation structure are performed in an order described in claim 1.

3. The method for manufacturing a nitride-based high electron mobility transistor according to claim 1, wherein in the formation of the element separation structure, the element separation structure is formed so as to have an overlap in a plan view with at least one part of the source recess etching region and the drain recess etching region.

4. The method for manufacturing a nitride-based high electron mobility transistor according to claim 1, wherein in the formation of the element separation structure, the element separation structure is formed by any one of the techniques of ion implantation, dry etching, and photoelectrochemical etching.

5. The method for manufacturing a nitride-based high electron mobility transistor according to claim 1, wherein in the formation of the element separation structure, the element separation structure is formed so as not to have overlap with an arrangement area of the conductive member in a plan view.

6. The method for manufacturing a nitride-based high electron mobility transistor according to claim 5, wherein in the formation of the element separation structure, the element separation structure is formed by ion implantation using the conductive member as at least a part of a mask.

7. The method for manufacturing a nitride-based high electron mobility transistor according to claim 5, wherein in the formation of the element separation structure, the element separation structure is formed by dry etching, at least in a state where a mask is formed to cover the source recess or the drain recess and the conductive member so as not to be exposed.

8. The method for manufacturing a nitride-based high electron mobility transistor according to claim 5, wherein in the formation of the element separation structure, the element separation structure is formed by photoelectrochemical etching, in a state where a mask is formed to expose at least a part of the conductive member.

9. The method for manufacturing a nitride-based high electron mobility transistor according to claim 8, wherein photoelectrochemical etching in the formation of at least one of the source recess and the drain recess is performed using an acidic etching solution, and photoelectrochemical etching in the formation of the element separation structure is performed using an alkaline etching solution.

10. The method for manufacturing a nitride-based high electron mobility transistor according to claim 1, wherein in the formation of the element separation structure, the element separation structure is formed so as to have an overlap with an arrangement region of the conductive member in a plan view.

11. The method for manufacturing a nitride-based high electron mobility transistor according to claim 10, wherein the formation of the element separation structure is performed after removing the conductive member.

12. The method for manufacturing a nitride-based high electron mobility transistor according to claim 1,
in the manufacturing of the nitride-based high electron mobility transistor, a plurality of high electron mobility transistors are manufactured, which are arranged in at least one direction of a gate length direction and a gate width direction on the nitride semiconductor crystal substrate, and
the conductive member is arranged between at least one of the high electron mobility transistor elements adjacent to each other in the gate length direction and the high electron mobility transistor elements adjacent to each other in the gate width direction.

13. The method for manufacturing a nitride-based high electron mobility transistor according to claim 12, wherein the conductive member arranged between the high electron mobility transistor elements adjacent to each other in the gate length direction has a shape extending in the gate width direction.

14. The method for manufacturing a nitride-based high electron mobility transistor according to claim 12, wherein the conductive member arranged between the high electron mobility transistor elements adjacent to each other in the gate width direction has a shape extending in the gate length direction.

15. The method for manufacturing a nitride-based high electron mobility transistor according to claim 1, further comprising:
forming another mask on the nitride semiconductor crystal substrate, the mask having an opening in a gate recess etching region where a gate recess is formed, which is a recess in which a gate electrode of the high electron mobility transistor is arranged;
forming the gate recess by performing other photoelectrochemical etching by irradiating the nitride semiconductor crystal substrate with light, in a state where the nitride semiconductor crystal substrate on which the conductive member is provided and the mask is formed is in contact with an etching solution containing an oxidizing agent that receives electrons.

16. The method for manufacturing a nitride-based high electron mobility transistor according to claim 15,
wherein
in the photoelectrochemical etching, the cap layer is removed, and in the above other photoelectrochemical etching, the cap layer and a part of the barrier layer are removed.

17. The method for manufacturing a nitride-based high electron mobility transistor according to claim 15,
wherein in the photoelectrochemical etching and the above other photoelectrochemical etching, light irradiation is performed using a same light source, and
the photoelectrochemical etching is stopped by time control, and the above other photoelectrochemical etching is stopped by self-stop.

* * * * *